(12) United States Patent
Xu et al.

(10) Patent No.: US 11,438,199 B1
(45) Date of Patent: Sep. 6, 2022

(54) CLOCK DUTY CYCLE CALIBRATION AND PHASE CALIBRATION FOR HIGH-SPEED TRANSMITTER

(71) Applicant: eTopus Technology Inc., San Jose, CA (US)

(72) Inventors: Danfeng Xu, Cupertino, CA (US); Xiaolong Liu, San Jose, CA (US); Hon Man Yau, Hong Kong (HK); Paul K. Lai, Los Gatos, CA (US); Kai Keung Chan, Fremont, CA (US)

(73) Assignee: eTopus Technology Inc., San Jose, CA (US)

( * ) Notice: Subject to any disclaimer, the term of this patent is extended or adjusted under 35 U.S.C. 154(b) by 0 days.

(21) Appl. No.: 17/323,398

(22) Filed: May 18, 2021

(51) Int. Cl.
| | |
|---|---|
| *H04L 25/49* | (2006.01) |
| *G06F 1/06* | (2006.01) |
| *H04L 43/028* | (2022.01) |
| *H04L 7/033* | (2006.01) |

(52) U.S. Cl.
CPC ............ *H04L 25/4917* (2013.01); *G06F 1/06* (2013.01); *H04L 43/028* (2013.01); *H04L 7/033* (2013.01)

(58) Field of Classification Search
CPC ... H04L 25/4917; H04L 43/028; H04L 7/033; G06F 1/06
See application file for complete search history.

(56) References Cited

U.S. PATENT DOCUMENTS

| | | | | |
|---|---|---|---|---|
| 2003/0167417 A1* | 9/2003 | To | ........................... | G11C 7/222 713/500 |
| 2008/0070537 A1* | 3/2008 | Lin | ........................... | H03L 7/06 455/260 |
| 2012/0269308 A1* | 10/2012 | Huang | ................. | G06F 13/4291 375/355 |
| 2019/0074958 A1* | 3/2019 | Liao | ........................ | H04L 7/033 |

OTHER PUBLICATIONS

Ali et al., "A 460mW 112Gb/s DSP-Based Transceiver with 38dB Loss Compensation for Next-Generation Data Centers in 7nm FinFET Technology," 2020 IEEE International Solid-State Circuits Conference, Feb. 2020, ISSCC 2021, Session 6, 6.2, pp. 118-119.
Kim et al., "A 224Gb/s DAC-Based PAM-4 Transmitter with 8-Tap FFE in10nm CMOS," 2021 IEEE International Solid-State Circuits Conference, Feb. 2021, ISSCC 2021, Session 8, 8.1, pp. 126-127.
Kim et al., "A 112Gb/s PAM-4 Transmitter with 3-Tap FFE in 10nm CMOS," 2018 IEEE International Solid-State Circuits Conference, Feb. 2018, ISSCC 2021, Session 6, 6.1, pp. 102-103.
Lacroix et al., "A 116Gb/s DSP based Wireline Transceiver in 7nm CMOS achieving 6pJ/bit at 45dB Loss in PAM-4/Duo-PAM-4 and 52dB in PAM-2," 2021 IEEE International Solid-State Circuits Conference, Feb. 2021, ISSCC 2021, Session 8, 8.4, pp. 132-133.

* cited by examiner

*Primary Examiner* — Dac V Ha
(74) *Attorney, Agent, or Firm* — Fenwick & West LLP

(57) ABSTRACT

A transmitter device having a calibrator circuit is disclosed. The calibrator circuit performs duty cycle calibration and phase calibration on a plurality of clock signals of the transmitter device. In one embodiment, the phase calibration is performed based on a comparison of the clock signals to (Continued)

a reference clock signal from the plurality of clock signals. In another embodiment, the calibrator circuit uses fixed patterns of data signals to perform phase calibration on the plurality of clock signals.

23 Claims, 11 Drawing Sheets

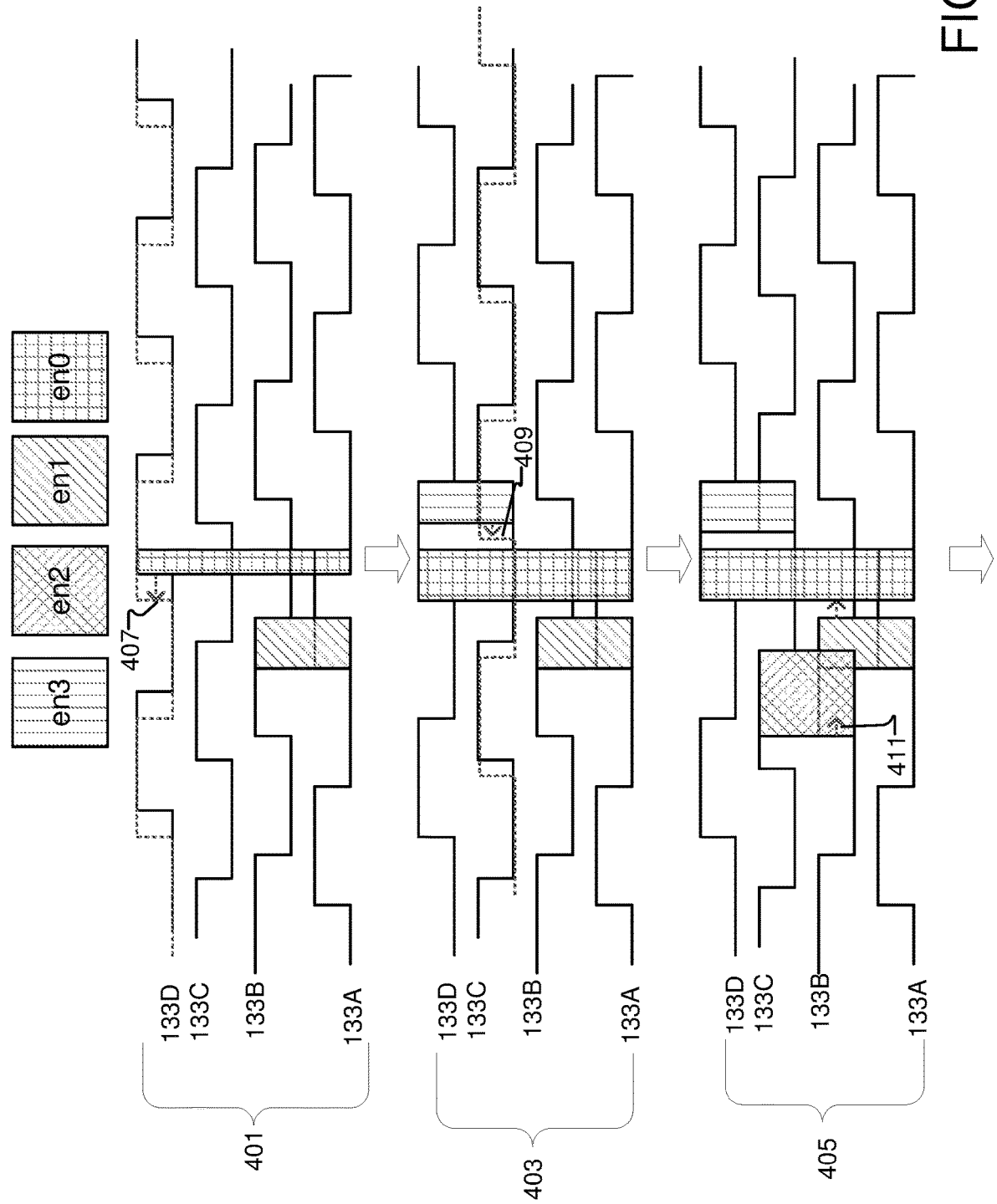

CLOCK DUTY CYCLE CALIBRATION AND PHASE CALIBRATION FOR HIGH-SPEED TRANSMITTER

BACKGROUND

1. Field of Art

The disclosure generally relates to a transmitter device, more specifically to clock duty cycle calibration and phase calibration of a transmitter device for transmitting data across a high speed communication channel.

2. Description of the Related Art

High speed communication systems transfer data over communication links at high baud rates (e.g., 56G baud rate and beyond). Clock generation for transmitting data at such high baud rates has many challenges. Conventional transmitters generate clock signals using either a 2T or 4T clock, but each type of clock has its drawbacks. For example, usage of a 2T clock in a high speed transmitter only requires duty cycle correction, but excess power is required to generate the 2T clock in a manner that maintains clock performance. In contrast, usage of a 4T clock in a high speed transmitter requires less power consumption than 2T clock implementations, but both duty cycle correction and phase correction are required. Clock phase accuracy in high speed transmitters that use 4T clocks is critical for performance. However, conventional high speed transmitters that use 4T clocks have inaccurate phase correction.

SUMMARY

In one embodiment, a transmitter device includes a clock calibrator circuit. During a calibration mode of the transmitter device, the clock calibrator circuit performs duty cycle calibration and phase calibration on clock signals of the transmitter device. The clock signals dictate the timing at which the transmitter device transmits data to a receiver device over a communication channel.

The clock calibrator circuit first performs duty cycle calibration on the clock signals followed by phase calibration of the clock signals. In one embodiment, the clock calibrator circuit calibrates the phase of the clock signals based on comparisons of the clock signals with a reference clock signal in an iterative manner where one of the clock signals is used as the reference clock signal.

In another embodiment, the transmitter device uses a fixed pattern of data signals as a proxy for the clock signals to calibrate the phase of the clock signals. Using the clock signals for phase calibration does not account for skew introduced by other components of the transmitter device during data transmission. In one embodiment, the transmitter device includes a dummy transmitter that transmits the fixed pattern of data signals that inherently has skew to the clock calibrator circuit. The clock calibrator circuit calibrates the phase of the data signals and uses the calibrated phase of the data signals to calibrate the clock signals.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes only, and may not have been selected to delineate or circumscribe the inventive subject matter.

BRIEF DESCRIPTION OF DRAWINGS

The disclosed embodiments have advantages and features that will be more readily apparent from the detailed description, the appended claims, and the accompanying figures (or drawings). A brief introduction of the figures is below.

Figure (FIG. 1) illustrates a high-speed communication system that includes a transmitter device and a receiver device in communication via a channel according to an embodiment.

FIG. 4A illustrates a process of phase correction of the clock signals based on the enable signals, according to an embodiment.

DETAILED DESCRIPTION

The Figures (FIGS.) and the following description relate to embodiments by way of illustration only. It should be noted that from the following discussion, alternative embodiments of the structures and methods disclosed herein will be readily recognized as viable alternatives that may be employed without departing from the principles of what is claimed. Reference will now be made in detail to several embodiments, examples of which are illustrated in the accompanying figures. It is noted that wherever practicable similar or like reference numbers may be used in the figures and may indicate similar or like functionality.

System Environment

Figure 1:
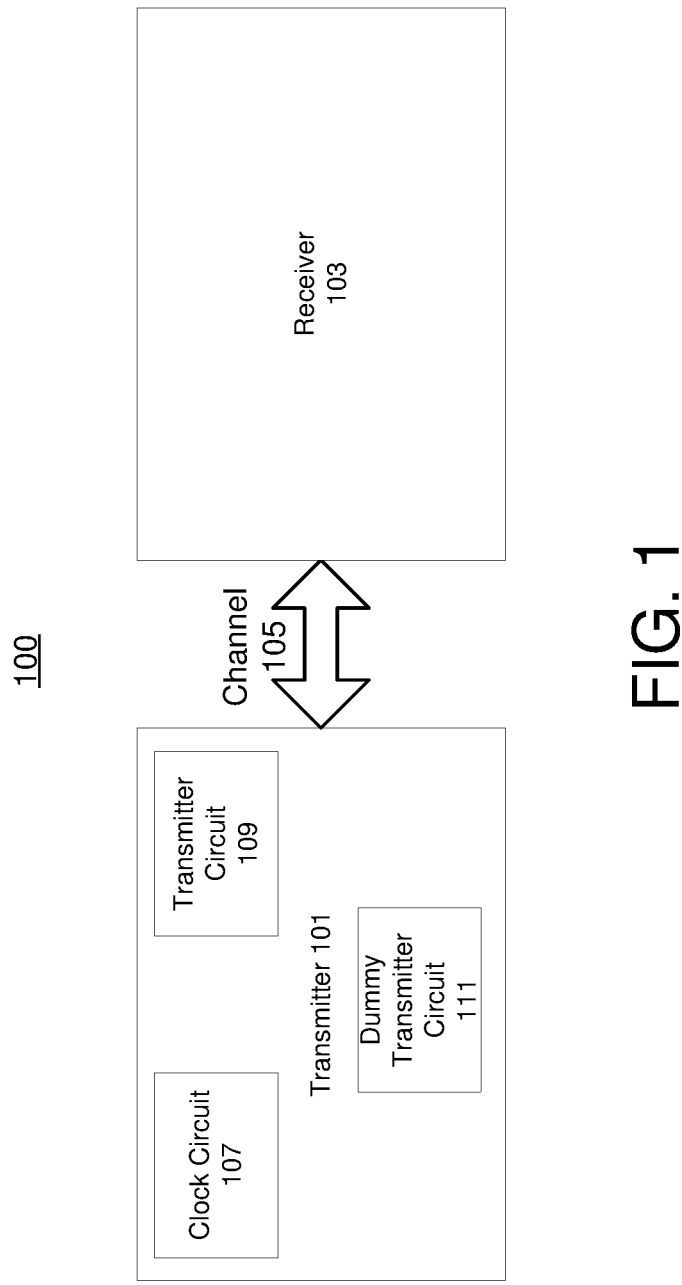

FIG. 1 is a high speed communication system 100 that includes a transmitter device 101 and a receiver device 103 coupled to each other through a communications channel 105, according to one embodiment. The communications channel 105 can be, for example, a copper communication channel found in a computing backplane that carries single ended or differential signals. The communications channel 105 can also be, for example, an optical communication channel that carries optical signals.

The transmitter device 101 transmits a channel signal to the receiver 103 across the channel 105. The channel signal represents digital data transmitted by the transmitter device 101. As shown in FIG. 1, the transmitter device 101 include a clock circuit 107 configured to generate clock signals, a transmitter circuit 109 configured to transmit the channel signal according to the generated clock signals, and a dummy transmitter circuit 111 configured to generate dummy data used for phase calibration according to one embodiment. The transmitter device 101 may have other circuits than shown in FIG. 1. In some embodiments, the transmitter device 101 may be a standalone device or a part of a larger device, such as an application specific integrated circuit (ASIC).

The receiver device 103 recovers the digital data from the channel signal received from the transmitter device 101 via the channel 105. In one embodiment, the receiver device 103 generates a digital data output representing the estimated digital value of the channel signal. In some embodiments, the receiver device 103 may be a standalone device or a part of a larger device, such as an application specific integrated circuit (ASIC).

Transmitter Device Architecture

Figure 2:
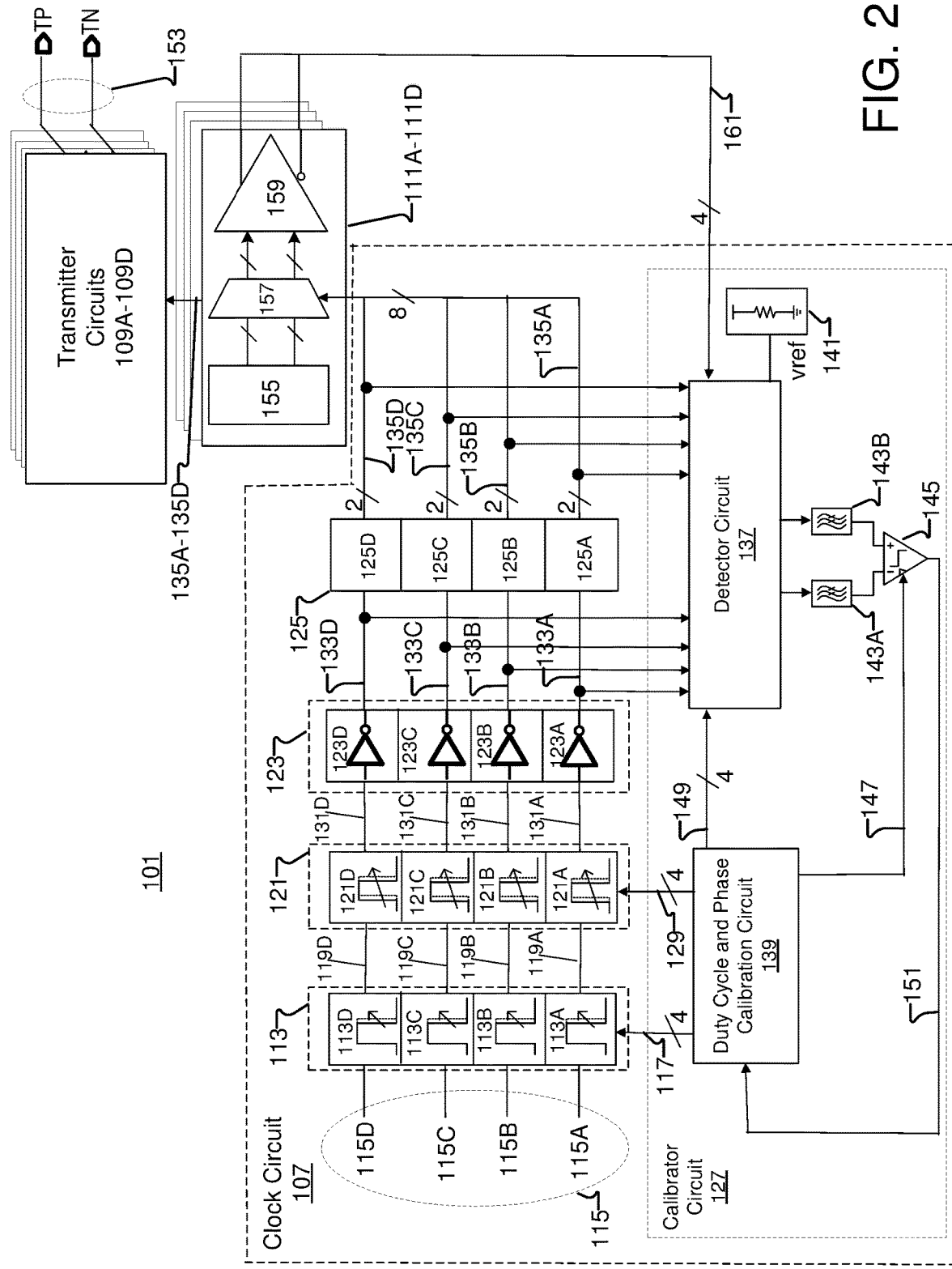
FIG. 2 is a detailed block diagram of the transmitter device, according to an embodiment.

FIG. 2 illustrates a detailed view of the transmitter device 101 according to one embodiment. As mentioned above, the transmitter device 101 includes the clock circuit 107, the transmitter circuit 109, and the dummy transmitter circuit 111 according to one embodiment. The clock circuit 107 generates duty cycle and phase calibrated clock signals. The clock signals control the timing at which the transmitter circuit 109 transmits the channel signal 153 to the receiver device 103. The clock signals also control the timing at which the dummy transmitter circuit 111 outputs dummy data signals for phase calibration, as will be further described below.

In one embodiment, the clock circuit 107 includes a duty cycle corrector 113, a phase corrector 121, a clock driver 123, a pulse generator 125, and a calibrator circuit 127. The clock circuit 107 may include other components than shown in FIG. 2 in other embodiments.

The duty cycle corrector 113 receives a plurality of clock signals 115 that are not duty cycle and phase corrected, and performs duty cycle correction on the clock signals 115. The duty cycle corrector 113 corrects each clock signal 115 according to one or more duty cycle correction signals 117 received from the calibrator circuit 127. In one embodiment, a duty cycle correction signal 117 specifies an amount of duty cycle adjustment to perform on a respective clock signal 115. For example, the duty cycle corrector 113 may adjust each clock signal 115 to have a 50% duty cycle based on a corresponding duty cycle correction signal 117. However, other duty cycles may be used in other embodiments.

In one embodiment, the plurality of clock signals 115 are 4T clock signals with a different phase for each clock signal. For example, if the transmitter device 101 is a 56G transmitter, each clock signal 115 is a 14G clock signal with ideally a 90-degree phase shift between each clock signal. In this example, under ideal conditions, clock signals 115 may include a first clock signal 115A with a 0-degree phase shift, a second clock signal 115B with a 90-degree phase shift, a third clock signal 115C with a 180-degree phase shift, and a fourth clock signal 115D with a 270-degree phase shift.

The clock signals 115 may be generated by a number of clock generation components such as a plurality of phase interpolators (not shown).

In one embodiment, the duty cycle corrector 113 includes a plurality of duty cycle correction circuits 113A to 113D. Each duty cycle correction circuit 113A to 113D is configured to perform duty cycle correction on a corresponding one of the plurality of clock signals 115A to 115D based on a corresponding duty cycle correction signal 117 received from the calibrator circuit 127. In one embodiment, the duty cycle corrector 113 receives a plurality of duty cycle correction signals 117 from the calibrator circuit 127. Each duty cycle correction signal is used by a corresponding one of the duty cycle correction circuits 113A to 113D during duty cycle correction. Each duty cycle correction circuit 113A to 113D generates a duty cycle corrected clock signal 119 according to the duty cycle correction signal 117 received by the duty cycle correction circuit 113A to 113D. For example, duty cycle correction circuit 113A performs duty cycle correction on clock signal 115A according to a first duty cycle correction signal and generates a duty cycle corrected clock signal 119A, duty cycle correction circuit 113B performs duty cycle correction on clock signal 115B according to a second duty cycle correction signal and generates a duty cycle corrected clock signal 119B, duty cycle correction circuit 113C performs duty cycle correction on clock signal 115C according to a third duty cycle correction signal and generates a duty cycle corrected clock signal 119C, and duty cycle correction circuit 113D performs duty cycle correction on clock signal 115D according to a fourth duty cycle correction signal and generates a duty cycle corrected clock signal 119D.

The phase corrector 121 receives the plurality of duty cycle corrected clock signals 119A to 119D and performs phase correction on the duty cycle corrected clock signals 119. In one embodiment, the phase corrector 121 corrects each duty cycle corrected clock signal 119A to 119D according to one or more phase correction signals 129 received from the calibrator circuit 127. In one embodiment, a phase correction signal 129 specifies an amount of phase adjustment to perform on a duty cycle corrected clock signal 119.

Under ideal conditions, the duty cycle corrected clock signals 119 may include a first duty cycle corrected clock signal 119A with a 0-degree phase shift, a second duty cycle corrected clock signal 119B with a 90-degree phase shift, a third duty cycle corrected clock signal 119C with a 180-degree phase shift, and a fourth duty cycle corrected clock signal 119D with a 270-degree phase shift in the case of a 4T clock, for example. However, in practice, the duty cycle corrected clock signals 119 are not phase-shifted by 90 degrees accurately and require phase correction to achieve a 90-degree phase shift between the duty cycle corrected clock signals 119A to 119D.

In one embodiment, the phase corrector 121 includes a plurality of phase correction circuits 121A to 121D. Each phase correction circuit 121A to 121D is configured to perform phase correction on a corresponding one of the plurality of duty cycle corrected clock signals 119A to 119D. In one embodiment, the phase corrector 121 receives a plurality of phase correction signals 129 from the calibrator circuit 127 where each phase correction signal is received by a corresponding one of the phase correction circuits 121A to 121D. Each phase correction circuit 121A to 121D generates a duty cycle and phase corrected clock signal 131 according to the phase correction signal 129 received by the phase correction circuit 121A to 121D. For example, phase correction circuit 131A performs phase correction on the first duty cycle corrected clock signal 119A according to a first phase correction signal and generates a first duty cycle and phase corrected clock signal 131A, phase correction circuit 121B performs phase correction on duty cycle corrected clock signal 119B according to a second phase correction signal and generates a second duty cycle and phase corrected clock signal 131B, phase correction circuit 121C performs phase correction on duty cycle corrected clock signal 119C according to a third phase correction signal and generates a third duty cycle and phase corrected clock signal 131C, and phase correction circuit 121D performs phase correction on duty cycle corrected clock signal 119D according to a fourth duty cycle correction signal and generates a fourth duty cycle and phase corrected clock signal 131D. In one embodiment, a duty cycle and phase corrected clock signal is corrected in terms of both duty cycle (e.g., 50% duty cycle) and phase (e.g., 90 degree phase difference between the clock signals).

The clock driver 123 receives the duty cycle and phase corrected clock signals 131A to 131D and buffers the duty cycle and phase corrected clock signals 131A to 131D. The clock driver 123 includes a plurality of driver circuits 123A to 123D. Each driver circuit 123A to 124D is configured to buffer its respective duty cycle and phase corrected clock signals 131A to 131D. That is, driver circuit 123A buffers duty cycle and phase corrected clock signal 131A to generate a duty cycle corrected (DCC) buffered clock signal 133A, driver circuit 123B buffers duty cycle and phase corrected clock signal 131B to generate a DCC corrected clock signal 133B, driver circuit 123C buffers duty cycle and phase corrected clock signal 131C to generate a DCC corrected clock signal 133C, and driver circuit 123D buffers duty cycle and phase corrected clock signal 131D to generate a DCC corrected clock signal 133D. As shown in FIG. 2, each driver circuit 123A to 120D includes an inverter according to one embodiment. Thus, the DCC corrected clock signals 133A to 133D are inverted versions of the duty cycle and phase corrected clock signals 131A to 131D.

The pulse generator 125 receives the DCC corrected clock signals 133A to 133D and generates corrected pulse signals 135A to 135D. Each corrected pulse signal 135A to 135D is a rectangular pulse wave having the desired duty cycle and phase. In one embodiment, the pulse generator 125 includes a plurality of pulse generator circuits 125A to 125D. Each pulse generator circuit 125A to 125D is configured to generate a corrected pulse signal from a corresponding two of the plurality of DCC corrected clock signals 133A to 133D as will be further described below. In one embodiment, the pulse generator circuit 125 also generates an inverse corrected pulse signal. The generation of each corrected pulse signal 135 is further described below with respect to phase calibration.

As mentioned above, the clock circuit 107 includes a calibrator circuit 127. In one embodiment, the calibrator circuit 127 generates the duty cycle correction signals 117 and the phase correction signals 129 used by the clock circuit 107 to correct the duty cycle and phase of the clock signals 115 as described above. As shown in FIG. 2, the calibrator circuit 127 includes a detector circuit 137, a duty cycle and phase calibration circuit 139, a reference generator 141, a plurality of filters 143A and 143B, and a comparator 145 according to one embodiment. The calibrator circuit 127 may include other components than shown in FIG. 2 in other embodiments.

Duty Cycle Calibration

During a calibration mode of the transmitter device 101, the calibrator circuit 127 performs an initial duty cycle calibration on the clock signals 115 prior to the initial phase calibration in one embodiment. To perform the initial duty cycle correction, the detector circuit 137 receives the DCC corrected clock signals 133 from the clock driver 123. Since the initial duty cycle calibration has yet to be performed on the clock signals 115, the DCC corrected clock signals 133A to 133D received from the clock driver 123 may have incorrect duty cycles that require correction.

The detector circuit 137 receives a first reference voltage (vref) used for duty cycle calibration from the reference generator 141. The reference generator 141 may include a resistor that reduces a supply voltage (VDD) to generate first reference voltage in one embodiment. The first reference voltage may represent a 50% duty cycle, for example. In one embodiment, the first reference voltage is half of the supply voltage (e.g., 0.5VDD).

The detector circuit 137 receives a plurality of selection signals 149 from the duty cycle and phase calibration circuit 139. In one embodiment, each selection signal 149 is a command to select a corresponding DCC corrected clock signal 133 for calibration. In one embodiment, only a single DCC corrected clock signal 133 can be calibrated at a time. Thus, only one of the selection signals 149 may be at a level that enables the detector circuit 137 to select the associated DCC corrected clock signal 133 for calibration while the remaining selection signals 149 disable the selection of the associated DCC corrected clock signals 133 for calibration.

The detector circuit 137 selects one of the DCC corrected clock signals 133 for calibration based on the selection signals 149. The detector circuit 137 transmits the selected DCC corrected clock signal 133 to the first filter 143A and transmits the first reference voltage to the second filter 143B. The first filter 143A filters noise from the selected DCC corrected clock signal 133 and the second filter 143B filters noise from the first reference voltage. In one embodiment, the first filter 143A and the second filter 143B are low pass filters.

The comparator 145 compares the filtered DCC corrected clock signal 133 and the filtered first reference voltage and outputs an error value 151 to the duty cycle and phase calibration circuit 139. The error value 151 indicates the difference between the filtered DCC corrected clock signal and the filtered first reference voltage. The difference represents the amount of duty cycle adjustment that is required to achieve the desired duty cycle (e.g., 50% duty cycle).

The duty cycle and phase calibration circuit 139 determines an amount (e.g., a magnitude) of duty cycle correction required to achieve the desired duty cycle for a given clock signal 115 based on the received error value 151 for the given clock signal 115. The duty cycle and phase calibration circuit 139 generates a duty cycle correction signal 117 for the given clock signal 115 based on the determined amount of duty cycle correction. The duty cycle correction circuit corresponding to the given clock signal corrects the duty cycle for the clock signal based on the duty cycle correction signal 117. The above process is repeated for each of the buffered clock signals 133 until the duty cycle and phase calibration circuit 139 generates a duty cycle correction signal 117 for all of the clock signals 115 during the calibration mode of the transmitter device 101.

Phase Calibration Based on Clock Signals

Once the duty cycles for all of the clock signals 115 are corrected, the calibrator circuit 127 performs phase calibration on the corrected pulse signals 135A to 135D during the calibration mode of the transmitter device 101. In one embodiment, phase calibration is performed on the corrected pulse signals 135A to 135D that are generated by the pulse generator 125. In contrast, duty calibration is performed on the DCC corrected clock signals 133A to 133D prior to be converted into the pulse wave by the pulse generator 125.

During the calibration mode of the transmitter device 101, the pulse generator 125 generates the plurality of corrected pulse signals 135A to 135D based on pairs of DCC corrected clock signals 133A to 133D. In one embodiment, the plurality of corrected pulse signals 135A to 135D include a plurality of enable signals en0 to en3. For example, corrected pulse signal 135A includes enable signal en2 and inverse enable signal enb2, corrected pulse signal 135B includes enable signal en3 and inverse enable signal enb3, corrected pulse signal 135C includes enable signal en0 and inverse enable signal enb0, and corrected pulse signal 135D includes enable signal en1 and inverse enable signal enb1.

Figure 3A:
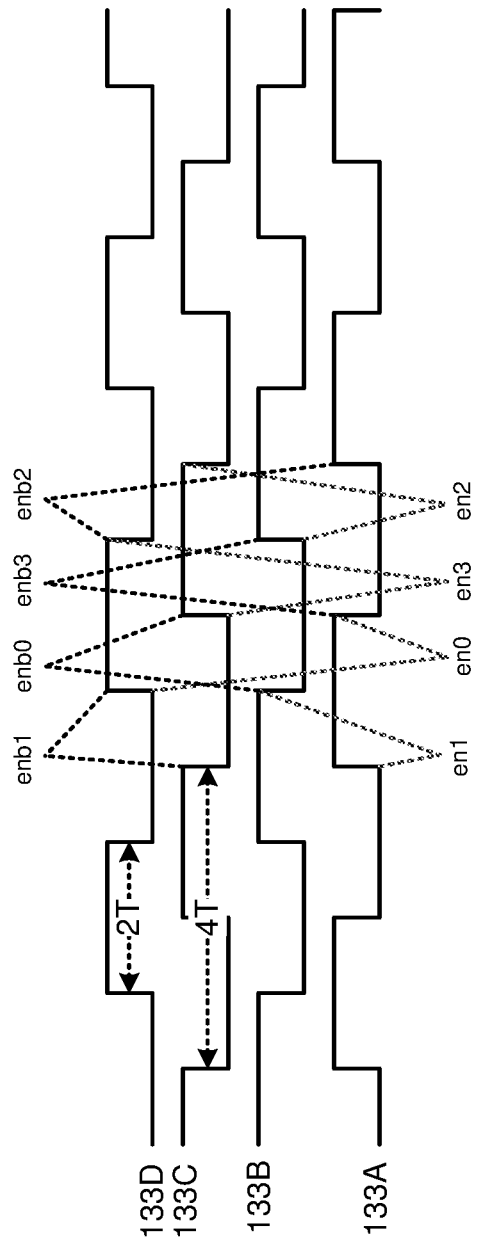
FIG. 3A is a wave form diagram of clock signals of the transmitter, according to an embodiment.
Figure 3B:
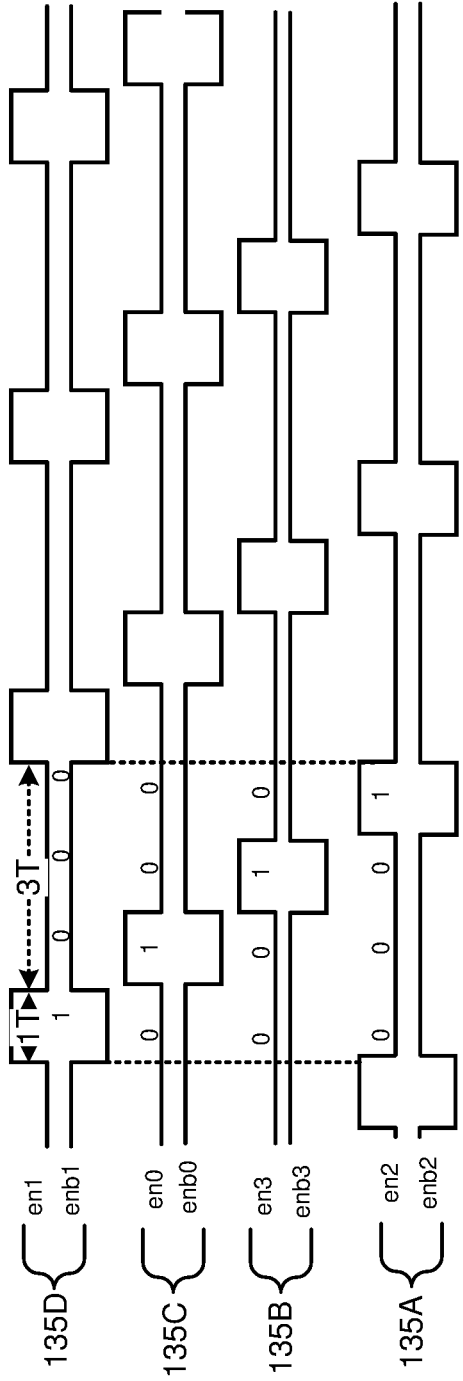
FIG. 3B is a wave form diagram of enable signals corresponding to the clock signals, according to an embodiment.

In one embodiment, each enable signal en* (where * is a natural number) is a waveform that indicates the overlapping period where the pair of DCC corrected clock signals 133 used to generate the enable signal are both at a high value (e.g., logical 1). FIG. 3A is a waveform diagram of the DCC corrected clock signals 133A to 1335D according to one embodiment. FIG. 3B is a waveform diagram of the corrected pulse signals 135A to 135D (e.g., the enable signals) for the pairs of the DCC corrected clock signals 133.

In one embodiment, the detector circuit 137 generates a first enable signal en0 (e.g., corrected pulse signal 135C) based on a logical AND operation on DCC corrected clock signal 133A and DCC corrected clock signal 133D according to Truth Table 1 shown below. As shown in FIGS. 3A and 3B, the first enable signal en0 is only high during the period of time when both DCC corrected clock signal 133A and DCC corrected clock signal 133D are simultaneously high.

TRUTH TABLE 1

| DCC Corrected clock signal 133A | DCC Corrected clock signal 133D | en0 |
| --- | --- | --- |
| 1 | 1 | 1 |
| 1 | 0 | 0 |
| 0 | 1 | 0 |
| 0 | 0 | 0 |

In one embodiment, the detector circuit 137 generates a second enable signal en1 (e.g., corrected pulse signal 135D) based on a logical AND operation on DCC corrected clock signal 133A and DCC corrected clock signal 133B according to Truth Table 2 shown below. As shown in FIGS. 3A and 3B, the second enable signal en1 is only high during the period of time when both DCC corrected clock signal 133A and DCC corrected clock signal 133B are simultaneously high.

TRUTH TABLE 2

| DCC Corrected clock signal 133A | DCC Corrected clock signal 133B | en1 |
| --- | --- | --- |
| 1 | 1 | 1 |
| 1 | 0 | 0 |
| 0 | 1 | 0 |
| 0 | 0 | 0 |

In one embodiment, the detector circuit 137 generates a third enable signal en2 (e.g., corrected pulse signal 135A) based on a logical AND operation on DCC corrected clock signal 133B and DCC corrected clock signal 133C according to Truth Table 3 shown below. As shown in FIGS. 3A and 3B, the third enable signal en2 is only high during the period of time when both DCC corrected clock signal 133B and DCC corrected clock signal 133C are simultaneously high.

TRUTH TABLE 3

| DCC Corrected clock signal 133B | DCC Corrected clock signal 133C | en2 |
| --- | --- | --- |
| 1 | 1 | 1 |
| 1 | 0 | 0 |
| 0 | 1 | 0 |
| 0 | 0 | 0 |

In one embodiment, the detector circuit 137 generates a fourth enable signal en3 (e.g., corrected pulse signal 135B) based on a logical AND operation on DCC corrected clock signal 133C and DCC corrected clock signal 133D according to Truth Table 4 shown below. As shown in FIGS. 3A and 3B, the fourth enable signal en3 is only high during the period of time when both DCC corrected clock signal 133C and DCC corrected clock signal 133D are simultaneously high.

TRUTH TABLE 4

| DCC Corrected clock signal 133C | DCC Corrected clock signal 133D | en3 |
| --- | --- | --- |
| 1 | 1 | 1 |
| 1 | 0 | 0 |
| 0 | 1 | 0 |
| 0 | 0 | 0 |

In one embodiment, the pulse generator 125 may generate a plurality of inverse enable signals enb0, enb1, enb2, and enb1 shown in FIG. 3B rather than the enable signals en0, en1, en2, and en3 or in addition to the enable signals en0, en1, en2, and en3 described above. The pulse generator 125 generates a first inverse enable signal en0 (e.g., corrected pulse signal 135C) based a logical OR operation on DCC corrected clock signal 133B and DCC corrected clock signal 133C according to Truth Table 5 shown below. As shown in FIGS. 3A and 3B, the first inverse enable signal enb0 is only low during the period of time when both DCC corrected clock signal 133B and DCC corrected clock signal 133C are simultaneously low.

TRUTH TABLE 5

| DCC Corrected clock signal 133B | DCC Corrected clock signal 133C | enb0 |
| --- | --- | --- |
| 1 | 1 | 1 |
| 1 | 0 | 1 |
| 0 | 1 | 1 |
| 0 | 0 | 0 |

In one embodiment, the detector circuit 137 generates a second inverse enable signal enb1 (e.g., corrected pulse signal 135D) based on a logical OR operation on DCC corrected clock signal 133C and DCC corrected clock signal 133D according to Truth Table 6 shown below. As shown in FIGS. 3A and 3B, the second inverse enable signal enb1 is only low during the period of time when both DCC corrected clock signal 133C and DCC corrected clock signal 133D are simultaneously low.

TRUTH TABLE 6

| DCC Corrected clock signal 133C | DCC Corrected clock signal 133D | enb1 |
| --- | --- | --- |
| 1 | 1 | 1 |
| 1 | 0 | 1 |
| 0 | 1 | 1 |
| 0 | 0 | 0 |

In one embodiment, the detector circuit 137 generates a third inverse enable signal enb2 (e.g., corrected pulse signal 135A) based on a logical OR operation on DCC corrected clock signal 133A and DCC corrected clock signal 133D according to Truth Table 7 shown below. As shown in FIGS. 3A and 3B, the third inverse enable signal enb2 is only low during the period of time when both DCC corrected clock signal 133A and DCC corrected clock signal 133D are simultaneously low.

TRUTH TABLE 7

| DCC Corrected clock signal 133A | DCC Corrected clock signal 133D | enb2 |
| --- | --- | --- |
| 1 | 1 | 1 |
| 1 | 0 | 1 |
| 0 | 1 | 1 |
| 0 | 0 | 0 |

Lastly, the detector circuit 137 generates a fourth inverse enable signal enb3 (e.g., corrected pulse signal 135B) based on a logical OR operation on DCC corrected clock signal 133A and DCC corrected clock signal 133B according to Truth Table 8 shown below. As shown in FIGS. 3A and 3B, the fourth inverse enable signal enb3 is only low during the period of time when both DCC corrected clock signal 133A and DCC corrected clock signal 133B are simultaneously low.

TRUTH TABLE 8

| DCC Corrected clock signal 133A | DCC Corrected clock signal 133B | enb3 |
| --- | --- | --- |
| 1 | 1 | 1 |
| 1 | 0 | 1 |
| 0 | 1 | 1 |
| 0 | 0 | 0 |

Referring back to FIG. 2, after enable or inverse enable signals are generated, the detector circuit 137 selects one of the DCC corrected clock signals 133 for calibration based on the selection signals 149. In one embodiment, the DCC corrected clock signals 133 are calibrated in a predetermined order. For example, the predetermined order results in the fourth DCC corrected clock signal 133D being calibrated, followed by the third DCC corrected clock signal 133C, and followed by the second DCC corrected clock signal 133D. The first DCC corrected clock signal 133A is used as a reference clock signal in one embodiment.

Rather than transmit the selected DCC corrected clock signal to the first filter 143A, the detector circuit 137 transmits one of the corrected pulse signals 135 (e.g., enable signal or inverse enable signal) that is associated with the DCC corrected clock signal 133 that is being calibrated. In the example described herein, phase calibration is performed using the enable signal (en*), but phase calibration can also be performed using the inverse enable signal (enb*). For example, fourth DCC corrected clock signal 133C is associated with the first enable signal en0 (e.g., corrected pulse signal 135C), the third DCC corrected clock signal 133C is associated with the fourth enable signal en3 (e.g., corrected pulse signal 135B), and the second DCC corrected clock signal 133B is associated with the third enable signal en2 (e.g., corrected pulse signal 135A) in one embodiment. The remaining enable signal en1 (e.g., corrected pulse signal 135D) is associated with the first DCC corrected clock signal 133A and is used as the reference during phase calibration in one embodiment.

In one embodiment, the calibrator circuit 127 calibrates the clock signals in a predetermined order. For example, the predetermined order includes the fourth DCC corrected clock signal 133D, the third DCC corrected clock signal 133C, and the second DCC corrected clock signal 133B. To calibrate the clock signals in the predetermined order, the detector circuit 137 transmits the first enable signal en0 that is associated with the fourth DCC corrected clock signal 133D to the first filter 143A for filtering and transmits a second reference voltage received from the second filter 143B for filtering as previously described above. Next, the detector circuit 137 transmits the fourth enable signal en3 that is associated with the third DCC corrected clock signal 133C to the first filter 143A for filtering and transmits the second reference voltage to the second filter 145B for filtering. Lastly, the detector circuit 137 transmits the third enable signal en2 that is associated with the second DCC corrected clock signal 133B to the first filter 143A for filtering and transmits the second reference voltage to the second filter 143B for filtering.

In one embodiment, the detector circuit 137 uses different reference voltages for duty cycle calibration and phase calibration. The second reference voltage represents the enable signal en1 that is being used as a reference for phase calibration. In one embodiment, the second reference voltage may be 25 percent of the supply voltage VDD (e.g., 0.25VDD) if the enable signals are used for phase calibration. Alternatively, the second reference voltage may be 75 percent of the supply voltage VDD (e.g., 0.75VDD) if the inverted enable signals are used for phase calibration.

FIG. 4A illustrates a process for phase error detection according to one embodiment. Step 401 in FIG. 4A illustrates the phase error detection in the fourth DCC corrected clock signal 133D. The comparator 145 compares the pulse width of the first enable signal en0 with the pulse width (e.g., a reference pulse) of the second enable signal en1 as shown in step 401 and outputs an error value 151 to the duty cycle and phase calibration circuit 139. The error value 151 during phase calibration indicates the difference in pulse width between the first enable signal en0 and the second enable signal en1. The difference represents the amount of phase adjustment that is required to achieve the desired phase shift (e.g., 90-degree phase shift).

The duty cycle and phase calibration circuit 139 determines whether to increase the delay or reduce the delay of the fourth DCC corrected clock signal 133D based on the comparison. Responsive to the error value 151 in step 401 indicating that the second enable signal enb1 is greater than the first enable signal en0, the duty cycle and phase calibration circuit 139 determines a phase correction signal 129 that reduces 407 the delay between the fourth DCC corrected clock signal 133D and the first DCC corrected clock signal 133A by moving the fourth DCC corrected clock signal 133D in a first direction until the pulse widths of the second enable signal en1 and the first enable signal en0 are equal. Responsive to the error value 151 in step 401 indicating that the second enable signal en1 is less than the first enable signal en0, the duty cycle and phase calibration circuit 139 determines a phase correction signal 129 that increases the delay between the fourth DCC corrected clock signal 133D and the first DCC corrected clock signal 133A by moving the fourth DCC corrected clock signal 133D in a second direction until the pulse widths of the second enable signal en1 and the first enable signal en0 are equal. For example, step 403 in FIG. 4A illustrates that the pulse width of the second enable signal en1 and the first enable signal en0 are equal following phase calibration in step 401.

Figure 4B:
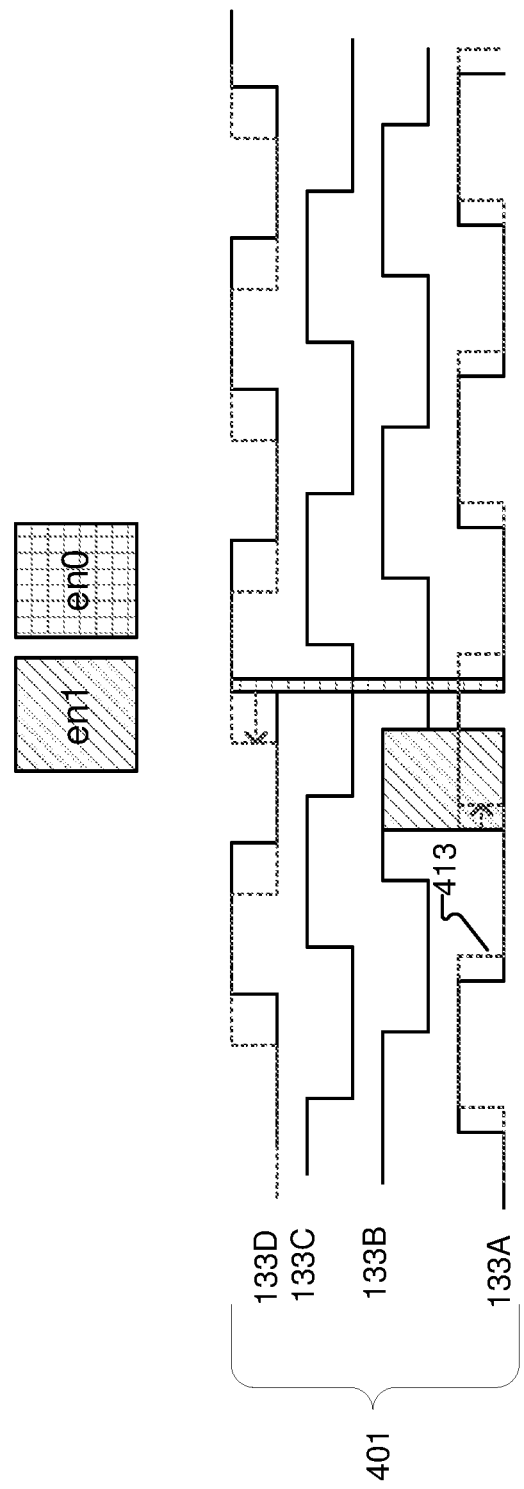
FIG. 4B illustrates a process of phase correction of a reference clock signal due to an overflow condition, according to an embodiment.

In one embodiment, the duty cycle and phase calibration circuit 139 determines whether the amount of adjustment of the fourth DCC corrected clock signal 133D to make the second enable signal en1 and the first enable signal en0 match is greater than a threshold value. In one embodiment, the threshold value is ¼VDD (e.g., 0.25VDD). Responsive to the amount of adjustment being less than the threshold, the duty cycle and phase calibration circuit 139 adjusts the fourth DCC corrected clock signal 133D according to the determined amount of adjustment. However, the duty cycle and phase calibration circuit 139 determines that an overflow condition occurs if the determined amount of adjustment that is greater than the threshold. Upon detection of the overflow condition, the duty cycle and phase calibration circuit 139 adjusts 413 the first DCC corrected clock signal 133A (e.g., the reference clock) until the pulse widths of the second enable signal en1 and the first enable signal en0 are equal as shown in FIG. 4B.

In step 403 in FIG. 4A, the phase error in the third DCC corrected clock signal 133C is determined. The comparator 145 compares the fourth enable signal en3 with the second enable signal en1 (e.g., the reference) as shown in step 403 and outputs an error value 151 to the duty cycle and phase calibration circuit 139. The error value 151 during phase calibration indicates the difference in pulse width between the fourth enable signal enb3 and the second enable signal enb1. The difference represents the amount of phase adjustment that is required to achieve the desired phase shift (e.g., 90-degree phase shift).

The duty cycle and phase calibration circuit 139 determines whether to increase the delay or reduce the delay of the third DCC corrected clock signal 133C based on the comparison. Responsive to the error value 151 in step 403 indicating that the second enable signal en1 is greater than the fourth enable signal en3, the duty cycle and phase calibration circuit 139 determines a phase correction signal 129 that reduces 409 the delay between the third DCC corrected clock signal 133C and the first DCC corrected clock signal 133A by moving the third DCC corrected clock signal 133C in the first direction until the pulse widths of the second enable signal en1 and the fourth enable signal en3 are equal. Responsive to the error value 151 in step 403 indicating that the second enable signal en1 is less than the fourth enable signal en3, the duty cycle and phase calibration circuit 139 determines a phase correction signal 129 that increases the delay between of the third DCC corrected clock signal 133C and the first DCC corrected clock signal 133A by moving the third DCC corrected clock signal 133C in the second direction until the pulse widths of the second enable signal en1 and the fourth enable signal en3 are equal.

Similar to step 401, the duty cycle and phase calibration circuit 139 determines whether the amount of adjustment of the third corrected clock signal 135C to make the second enable signal en1 and the fourth enable signal en3 match is greater than the threshold value described above. Responsive to the amount of adjustment being less than the threshold, the duty cycle and phase calibration circuit 139 adjusts the third DCC corrected clock signal 133C according to the determined amount. However, the duty cycle and phase calibration circuit 139 determines that the overflow condition occurs if the determined amount of adjustment that is greater than the threshold. Upon detection of the overflow condition, the duty cycle and phase calibration circuit 139 adjusts the first DCC corrected clock signal 133A being used as the reference until the pulse widths of the second enable signal en1 and the fourth enable signal en3 are equal.

In step 405 in FIG. 4A the phase error in the second DCC corrected clock signal 133B is determined. The comparator 145 compares the third enable signal en2 with the second enable signal en1 (e.g., the reference) as shown in step 405 and outputs an error value 151 to the duty cycle and phase calibration circuit 139. The error value 151 during phase calibration indicates the difference in pulse width between the third enable signal en2 and the second enable signal en1. The difference represents the amount of phase adjustment that is required to achieve the desired phase shift (e.g., 90-degree phase shift).

The duty cycle and phase calibration circuit 139 determines whether the error value 151 indicates a match between the pulse widths of the third enable signal en2 with the second enable signal en1. Responsive to the duty cycle and phase calibration circuit 139 determining the match, phase calibration between the DCC corrected clock signals 133 is complete. The completion of phase calibration signifies that the DCC corrected clock signals 133 have a 90-degree phase shift between each corrected clock signal 135.

However, responsive to the duty cycle and phase calibration circuit 139 determining that the error value indicates a mismatch (e.g., does not match) between the third enable signal en2 with the second enable signal en1, the duty cycle and phase calibration circuit 139 determines whether to increase the delay or reduce the delay of the second DCC corrected clock signal 133B based on the error value 151. Responsive to the error value 151 in step 403 indicating that the second enable signal en1 is less than the third enable signal en2, the duty cycle and phase calibration circuit 139 determines a phase correction signal 129 that reduces 411 the delay between the second DCC corrected clock signal 133B and the first DCC corrected clock signal 133A. In one embodiment, the duty cycle and phase calibration circuit 139 reduces the delay by moving the second DCC corrected clock signal by a single step in the first direction. In one embodiment, the size (e.g., magnitude) of the single step is configurable according to the application. In one example, the size of the single step is 100 femtoseconds (fs). However, the size of the single step may be different in other embodiments. Responsive to the error value 151 in step 403 indicating that the second enable signal en1 is greater than the first enable signal en0, the duty cycle and phase calibration circuit 139 determines a phase correction signal 129 that increases the delay between of the second DCC corrected clock signal 133B and the first DCC corrected clock signal 133A. In one embodiment, the duty cycle and phase calibration circuit 139 increases the delay by moving the second DCC corrected clock signal 133B by a single step in the second direction. In one embodiment, the calibrator circuit 127 repeats the above steps 401 to 405 for phase calibration of the DCC corrected clock signals 133 until the pulse widths of the third enable signal en2 with the second enable signal en1 match.

Once duty cycle calibration and phase calibration are complete, the calibrator circuit 127 is disabled (e.g., turned off) in one embodiment. By disabling the calibrator circuit 127, power consumption by the transmitter device 101 is reduced. The calibrator circuit 127 may be re-enabled periodically to perform duty cycle calibration and phase calibration or may be manually re-enabled to perform duty cycle calibration and phase calibration.

In other embodiments, the calibrator circuit 127 remains enabled during data transmission to continuously perform real time duty cycle calibration and phase calibration. By performing real time duty cycle calibration and phase calibration, any deviations in the calibration due to temperature and voltage variation are accounted for by the calibrator circuit 127.

Data Transmission

Referring back to FIG. 2, the transmitter circuit 109 transmits data 153 to the receiver device 103 via the channel 105. In one embodiment, the transmitter device 101 includes a plurality of transmitter circuits 109A to 109D. Each transmitter circuit 109A to 109D receives a corresponding one of the corrected pulse signals 135A to 135D that are duty cycle corrected and phase corrected as described above. For example, transmitter circuit 109A receives corrected pulse signal 135A, transmitter circuit 109B receives corrected pulse signal 135B, and so on. Each transmitter circuit 109A to 109D receives corresponding data for the transmitter circuit and is configured to output the received data to the receiver device 103 based on the corrected pulse signal received by the transmitter circuit.

The transmitter circuits 109A to 109D include components such as multiplexors and drivers that are used to output the data to the receiver device 103. The components of the transmitter circuits 109A-109D may further skew the timing at which the data is outputted. Since the phase calibration performed by the calibrator circuit 127 using the DCC corrected clock signals 133 does not account for the skew generated at the transmitter circuits 109A to 109D, the data outputted by each of the transmitter circuits 109A-109D may not be at a desired phase shift (e.g., 90-degree phase shift between the clock signals).

Phase Calibration Based on Dummy Data

In one embodiment, the dummy transmitter circuit 111 generates dummy data signals that are used by the calibrator circuit 127 to perform phase calibration during the calibration mode of the transmitter device 101. The dummy data signals may be used for phase calibration instead of the DCC corrected clock signals 133 as previously described above. The skew in the dummy data signals outputted by the dummy transmitter circuit 111 is representative of the skew in the data outputted by the transmitter circuits 109A to 109D. By using the dummy data signals to perform phase calibration, the skew that occurs at the transmitter circuits 109A to 109D is accounted for by the calibrator circuit 127.

In one embodiment, the transmitter device 101 includes a plurality of dummy transmitter circuits 111A to 111D. Each dummy transmitter circuit 109A to 109D receives a corresponding one of the corrected pulse signals 135A to 135D. The corrected pulse signals 135A to 135D are duty cycle corrected, but not phase corrected during the initial calibration of phase as previously described above. For example, dummy transmitter circuit 111A receives corrected pulse signal 135A, dummy transmitter circuit 111B receives corrected pulse signal 135B, and so on. Each dummy transmitter circuit 111A to 111D outputs dummy data signals to the calibrator circuit 127 according to the corrected pulse signal received by the dummy transmitter circuit.

As shown in FIG. 2, each dummy transmitter circuit 111A to 111D includes a pattern generator 155, a multiplexor 157, and a driver 159 in one embodiment. Each dummy transmitter 111 may include other components than shown in FIG. 2. In one embodiment, the pattern generator 155 for each dummy transmitter circuit 111A to 111D generates one or more fixed patterns of dummy data signals that are output to the calibrator circuit 127. For example, the pattern generator 155 may generate the following fixed patterns of dummy data "1000," "0100," "0010," and "0001."

The multiplexor 157 receives the fixed patterns of dummy data signals from the pattern generator 155. The multiplexor 157 selects one of the fixed patterns of dummy data signals for output to the driver 159 according to the corrected pulse signals 135 output by the clock circuit 107. The driver 159 outputs to the calibrator circuit 127 an output signal 161 that includes the selected fixed pattern of dummy data signals.

Figure 5A:
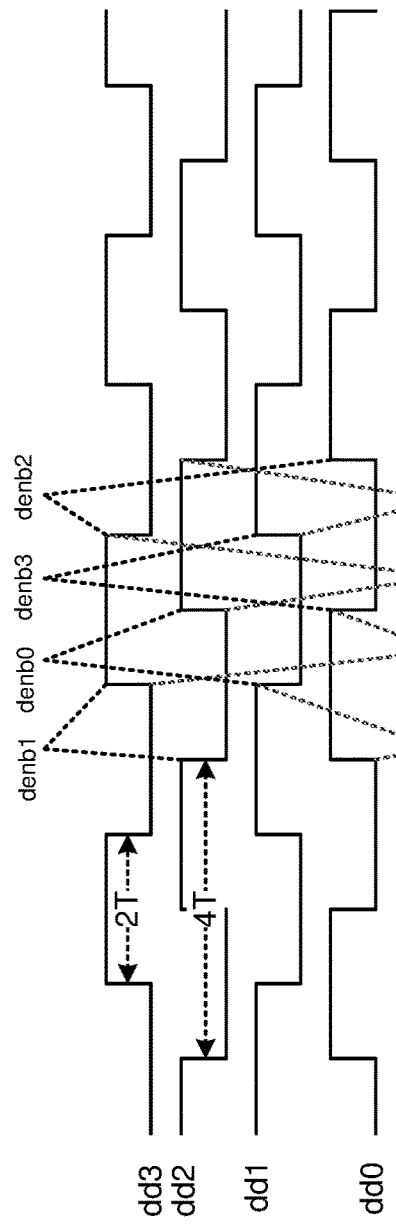
FIG. 5A is a wave form diagram of dummy data signals of the transmitter device, according to another embodiment.
Figure 5B:
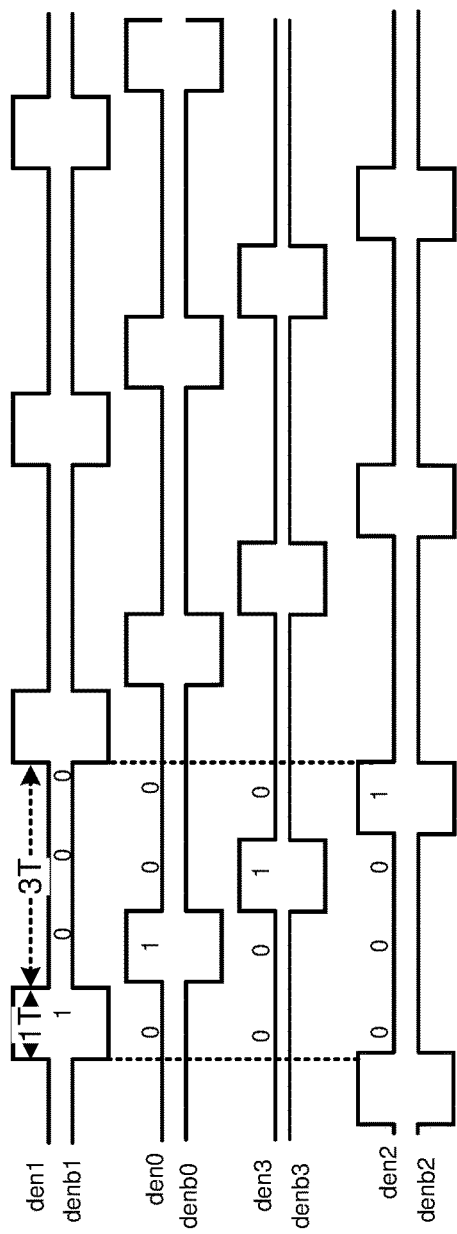
FIG. 5B is a wave form diagram of dummy data enable signals corresponding to the dummy data signals, according to another embodiment.

The detector circuit 137 receives the output signal 161 from the dummy transmitter circuit 111 and performs phase calibration based on the dummy data signals included in the output signal 161. To perform phase calibration, similar to the discussion above, the detector circuit 137 generates dummy enable signals for pairs of dummy data signals. In one embodiment, each dummy enable signal is a waveform that indicates the overlapping period where the pair of dummy data signals used to generate the dummy enable signal are at a high value (e.g., logical 1). FIG. 5A is a waveform diagram of the dummy data signals dd0 to dd3. FIG. 5B is a waveform diagram of the dummy enable signals for the pairs of corrected clock signals 135.

In one embodiment, the detector circuit 137 generates a first dummy enable signal den0 based a logical AND operation on dummy data signal dd3 and dummy data signal dd0 according to Truth Table 9 shown below. As shown in FIGS. 5A and 5B, the first dummy enable signal den0 is only high during the period of time when both dummy data signal dd3 and dummy data signal dd0 are simultaneously high.

TRUTH TABLE 9

| Dummy Data Signal dd3 | Dummy Data Signal dd0 | Dummy Enable Signal den0 |
|---|---|---|
| 1 | 1 | 1 |
| 1 | 0 | 0 |
| 0 | 1 | 0 |
| 0 | 0 | 0 |

In one embodiment, the detector circuit 137 generates a second dummy enable signal dent based on a logical AND operation on dummy data signal dd0 and dummy data signal dd1 according to Truth Table 10 shown below. As shown in FIGS. 5A and 5B, the second dummy enable signal den1 is only high during the period of time when both dummy data signal dd0 and dummy data signal dd1 are simultaneously high.

TRUTH TABLE 10

| Dummy Data Signal dd0 | Dummy Data Signal dd1 | Dummy Enable Signal den1 |
|---|---|---|
| 1 | 1 | 1 |
| 1 | 0 | 0 |
| 0 | 1 | 0 |
| 0 | 0 | 0 |

In one embodiment, the detector circuit 137 generates a third dummy enable signal den2 based on a logical AND operation on dummy data signal dd1 and dummy data signal dd2 according to Truth Table 11 shown below. As shown in FIGS. 5A and 5B, the third dummy enable signal den2 is only high during the period of time when both dummy data signal dd1 and dummy data signal dd2 are simultaneously high.

TRUTH TABLE 11

| Dummy Data Signal dd1 | Dummy Data Signal dd2 | Dummy Enable Signal den2 |
|---|---|---|
| 1 | 1 | 1 |
| 1 | 0 | 0 |
| 0 | 1 | 0 |
| 0 | 0 | 0 |

In one embodiment, the detector circuit 137 generates a fourth dummy enable signal den3 based on a logical AND operation on dummy data signal dd2 and dummy data signal dd3 according to Truth Table 12 shown below. As shown in FIGS. 5A and 5B, the fourth dummy enable signal den3 is only high during the period of time when both dummy data signal dd0 and dummy data signal dd3 are simultaneously high.

TRUTH TABLE 12

| Dummy Data Signal dd2 | Dummy Data Signal dd3 | Dummy Enable Signal den3 |
|---|---|---|
| 1 | 1 | 1 |
| 1 | 0 | 0 |
| 0 | 1 | 0 |
| 0 | 0 | 0 |

In one embodiment, the detector 137 may generate inverse dummy enable signals denb0, denb1, enb2, and denb1 shown in FIG. 5B rather than or in addition to the dummy enable signals den0, den1, den2, and den3 described above. The detector circuit 137 generates a first inverse dummy enable signal denb0 based a logical OR operation on dummy data signal dd1 and dummy data signal dd2 according to Truth Table 13 shown below. As shown in FIGS. 5A and 5B, the first inverse dummy enable signal denb0 is only low during the period of time when both dummy data signal dd1 and dummy data signal dd2 are simultaneously low.

TRUTH TABLE 13

| Dummy Data Signal dd1 | Dummy Data Signal dd2 | Inverse Dummy Enable Signal denb0 |
|---|---|---|
| 1 | 1 | 1 |
| 1 | 0 | 1 |
| 0 | 1 | 1 |
| 0 | 0 | 0 |

In one embodiment, the detector circuit 137 generates a second inverse dummy enable signal denb1 based on a logical OR operation on dummy data signal dd2 and dummy data signal dd3 according to Truth Table 14 shown below. As shown in FIGS. 5A and 5B, the second inverse dummy enable signal denb1 is only low during the period of time when both dummy data signal dd2 and dummy data signal dd3 are simultaneously low.

TRUTH TABLE 14

| Dummy Data Signal dd2 | Dummy Data Signal dd3 | Inverse Dummy Enable |
|---|---|---|
| 1 | 1 | 1 |
| 1 | 0 | 1 |
| 0 | 1 | 1 |
| 0 | 0 | 0 |

In one embodiment, the detector circuit 137 generates a third inverse dummy enable signal denb2 based on a logical OR operation on dummy data signal dd0 and dummy data signal dd3 according to Truth Table 15 shown below. As shown in FIGS. 5A and 5B, the third inverse dummy enable signal denb2 is only low during the period of time when both dummy data signal dd0 and dummy data signal dd3 are simultaneously low.

TRUTH TABLE 15

| Dummy Data Signal dd0 | Dummy Data Signal dd3 | Inverse Dummy Enable Signal denb2 |
|---|---|---|
| 1 | 1 | 1 |
| 1 | 0 | 1 |
| 0 | 1 | 1 |
| 0 | 0 | 0 |

Lastly, the detector circuit 137 generates a fourth inverse dummy enable signal denb3 based on a logical OR operation on dummy data signal dd0 and dummy data signal dd1 according to Truth Table 16 shown below. As shown in FIGS. 5A and 5B, the fourth inverse dummy enable signal denb3 is only low during the period of time when both dummy data signal dd0 and dummy data signal dd1 are simultaneously low.

TRUTH TABLE 16

| Dummy Data Signal dd0 | Dummy Data Signal dd1 | Inverse Dummy Enable Signal denb3 |
|---|---|---|
| 1 | 1 | 1 |
| 1 | 0 | 1 |
| 0 | 1 | 1 |
| 0 | 0 | 0 |

After dummy enable or inverse dummy enable signals are generated, the detector circuit 137 selects one of the dummy data signals for calibration based on the selection signals 149. In one embodiment, the dummy data signals are calibrated in a predetermined order similar to phase calibration using the corrected clock signals 135. For example, the fourth dummy data signal dd3 is first calibrated, followed by the third dummy data signal dd2, followed by the second dummy data signal dd2. The first dummy data signal dd0 is used as a reference data signal in one embodiment.

Rather than transmit the selected dummy data signal to the first filter 143A, the detector circuit 137 transmits one of the dummy enable signal or inverse dummy enable signal that is associated with the dummy data signal that is being calibrated. In the example described herein, phase calibration is performed using the dummy enable signal (den*), but phase calibration can also be performed using the inverse dummy enable signal (denb*). For example, the fourth dummy data signal dd3 is associated with the first dummy enable signal den0, the third dummy data signal dd2 is associated with the fourth dummy enable signal den3, and the second dummy data signal dd1 is associated with the third dummy enable signal den2 in one embodiment. The second dummy enable signal dent is associated with the first dummy data signal dd0 and is used as the reference in one embodiment.

The detector circuit 137 transmits the first dummy enable signal den0 that is associated with the fourth dummy data signal dd3 to the first filter 143A for filtering and transmits the second reference voltage to the second filter 143B for filtering as previously described above. The second reference voltage may represent the dummy enable signal dent that is being used as a reference for phase calibration. In one embodiment, the second reference voltage may be 25 percent of the supply voltage VDD (e.g., 0.25VDD) if the dummy enable signals are used for phase calibration. Alternatively, the second reference voltage may be 75 percent of the supply voltage VDD (e.g., 0.75VDD) if the inverted dummy enable signals are used for phase calibration.

Figure 6A:
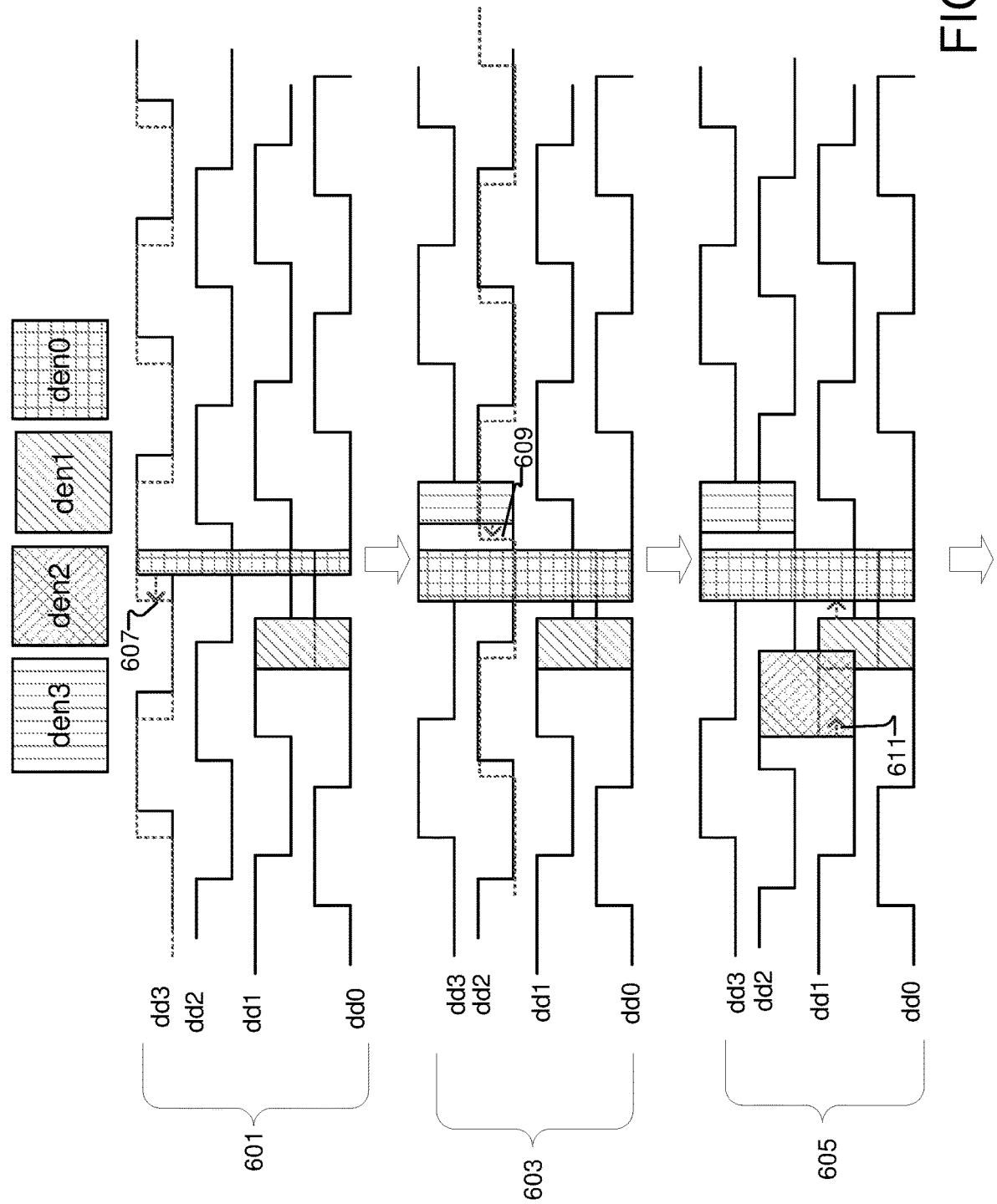
FIG. 6A illustrates a process of phase correction of clock signals based on the dummy data signals, according to another embodiment.

FIG. 6A illustrates a process for phase error detection using the dummy data signals according to one embodiment. Step 601 in FIG. 6A illustrates the phase error detection in the fourth dummy data signal dd3. The comparator 145 compares the pulse width of the first dummy enable signal den0 with the pulse width of the second dummy enable signal dent (e.g., the reference) as shown in step 601 and outputs an error value 151 to the duty cycle and phase calibration circuit 139. The error value 151 during phase calibration indicates the difference in pulse width between the first dummy enable signal den0 and the second dummy enable signal den1. The difference represents the amount of phase adjustment that is required to achieve the desired phase (e.g., 90-degree phase shift).

The duty cycle and phase calibration circuit 139 determines whether to increase the delay or reduce the delay of the fourth dummy data signal dd3 based on the comparison. Responsive to the error value 151 in step 601 indicating that the second dummy enable signal dent is greater than the first dummy enable signal den0, the duty cycle and phase calibration circuit 139 determines a correction that reduces 607 the delay between the fourth dummy data signal dd3 and the first dummy data signal dd0 by moving the fourth dummy data signal dd3 in the first direction until the pulse widths of the second dummy enable signal den1 and the first dummy enable signal den0 are equal. Responsive to the error value 151 in step 401 indicating that the second dummy enable signal dent is less than the first dummy enable signal den0, the duty cycle and phase calibration circuit 139 determines a correction that increases the delay between the fourth dummy data signal dd3 and the first dummy data signal dd0 by moving the fourth dummy data signal dd3 in the second direction until the pulse widths of the second dummy enable signal dent and the first dummy enable signal den0 are equal.

In one embodiment, the phase corrections applied to the dummy data signals are used as a proxy for the phase corrections required for the DCC corrected clock signals 133. The duty cycle and phase calibration circuit 139 determines a phase correction signal 129 for the clock signal associated with the adjusted dummy data signal based on the amount of correction required for the dummy data signal. Here, DCC corrected clock signal 133D (and its corresponding clock signals 113D, 119D, 131D, and 135D) is associated with the dummy data signal dd3. Thus, the duty cycle and phase calibration circuit 139 determines the phase correction signal 129 to correct the phase of the duty cycle corrected clock signal 119D based on the correction for the fourth dummy data signal dd3. In one embodiment, the amount of correction specified in the phase correction signal 129 is the same (e.g., matches) the amount of correction for the fourth dummy data signal dd3.

Figure 6B:
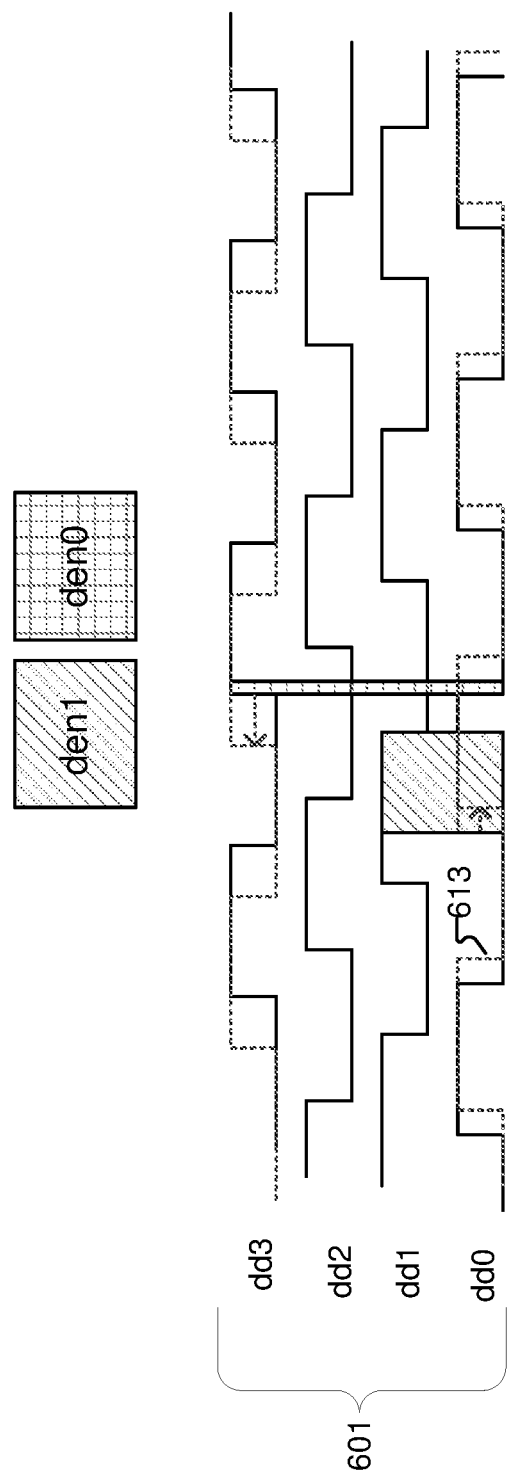
FIG. 6B illustrates a process of phase correction of a reference data signal due to an overflow condition, according to another embodiment.

In one embodiment, the duty cycle and phase calibration circuit 139 determines whether the amount of adjustment of the fourth dummy data signal dd3 to make the second dummy enable signal dent and the first dummy enable signal den0 match is greater than a threshold value. In one embodiment, the threshold value is ¼ Vdd (e.g., 0.25Vdd). Responsive to the amount of adjustment being less than the threshold, the duty cycle and phase calibration circuit 139 adjusts the fourth dummy data signal dd3 according to the determined amount. However, the duty cycle and phase calibration circuit 139 determines that an overflow condition occurs if the determined amount of adjustment that is greater than the threshold. Upon detection of the overflow condition, the duty cycle and phase calibration circuit 139 adjusts 613 the first dummy data signal dd0 being used as the reference until the pulse widths of the second dummy enable signal dent and the first dummy enable signal den0 are equal as shown in FIG. 6B.

In step 603 in FIG. 6A the phase error in the third dummy data signal dd2 is determined. The comparator 145 compares the fourth dummy enable signal den3 with the second dummy enable signal dent (e.g., the reference) as shown in step 603 and outputs an error value 151 to the duty cycle and phase calibration circuit 139. The error value 151 during phase calibration indicates the difference in pulse width between the fourth dummy enable signal den3 and the second dummy enable signal den1. The difference represents the amount of phase adjustment that is required to achieve the desired phase (e.g., 90-degree phase shift).

The duty cycle and phase calibration circuit 139 determines whether to increase the delay or reduce the delay of the third dummy data signal dd2 based on the comparison. Responsive to the error value 151 in step 603 indicating that the second dummy enable signal denb1 is greater than the fourth dummy enable signal den3, the duty cycle and phase calibration circuit 139 determines a phase correction signal 129 that reduces 609 the delay between the third dummy data signal dd2 and the first dummy data signal dd0 by moving the third dummy data signal dd2 in the first direction until the pulse widths of the second dummy enable signal dent and the fourth dummy enable signal den3 are equal. Responsive to the error value 151 in step 603 indicating that the second dummy enable signal dent is less than the fourth dummy enable signal den3, the duty cycle and phase calibration circuit 139 determines a correction that increases the delay between of the third dummy data signal dd2 and the first dummy data signal dd0 by moving the third dummy data signal dd2 in the second direction until the pulse widths of the second dummy enable signal dent and the fourth dummy enable signal den3 are equal.

The duty cycle and phase calibration circuit 139 determines a phase correction signal 129 for the clock signal associated with the third dummy data signal dd2 based on the correction for the third dummy data signal dd2. Here, DCC corrected clock signal 133C (and its corresponding clock signals 113C, 119C, 131C, and 135C) is associated with the third dummy data signal dd2. Thus, the duty cycle and phase calibration circuit 139 determines the phase correction signal 129 to correct the phase of the duty cycle corrected clock signal 119C based on the correction for the third dummy data signal dd2. In one embodiment, the amount of correction specified in the phase correction signal 129 is the same (e.g., matches) the amount of correction for the third dummy data signal dd2.

Similar to step 401, the duty cycle and phase calibration circuit 139 determines whether the amount of adjustment of the third dummy data signal dd2 to make the second dummy enable signal dent and the fourth dummy enable signal den3 match is greater than the threshold value. Responsive to the amount of adjustment being less than the threshold, the duty cycle and phase calibration circuit 139 adjusts the third dummy data signal dd2 according to the determined amount. However, the duty cycle and phase calibration circuit 139 determines that an overflow condition occurs if the determined amount of adjustment that is greater than the threshold. Upon detection of the overflow condition, the duty cycle and phase calibration circuit 139 adjusts the first dummy data signal dd0 being used as the reference until the pulse widths of the second dummy enable signal dent and the fourth dummy enable signal den3 are equal.

In step 605 in FIG. 6A the phase error in the second dummy data signal dd1 is determined. The comparator 145 compares the third dummy enable signal den2 with the second dummy enable signal dent (e.g., the reference) as shown in step 605 and outputs an error value 151 to the duty cycle and phase calibration circuit 139. The error value 151 during phase calibration indicates the difference in pulse width between the third dummy enable signal den2 and the second dummy enable signal den1. The difference represents the amount of phase adjustment that is required to achieve the desired phase (e.g., 90-degree phase shift).

The duty cycle and phase calibration circuit 139 determines whether the error value 151 indicates a match between the pulse widths of the third dummy enable signal den2 and the second dummy enable signal den1. Responsive to the duty cycle and phase calibration circuit 139 determining the match, phase calibration between the dummy data signals is complete. The completion of phase calibration of the dummy data signals signifies that the DCC corrected clock signals 133 have a desired phase shift (e.g., 90-degree phase shift) between each DCC corrected clock signal 133 and accounts for any timing skew introduced by the components of the transmitter circuits 109A to 109D.

However, responsive to the duty cycle and phase calibration circuit 139 determining that the error value indicates a mismatch (e.g., does not match) between the third dummy enable signal den2 with the second dummy enable signal den1, the duty cycle and phase calibration circuit 139 determines whether to increase the delay or reduce the delay of the second dummy data signal dd1 based on the error value 151. Responsive to the error value 151 in step 603 indicating that the pulse width of the second dummy enable signal dent is less than the third dummy enable signal den2, the duty cycle and phase calibration circuit 139 determines a correction that reduces 611 the delay between the second dummy data signal dd1 and the first dummy data signal dd1. In one embodiment, the duty cycle and phase calibration circuit 139 reduces the delay by moving the second dummy data signal dd1 by a single step in the first direction. As mentioned above, the size of the single step is configurable and may be 100 fs in one embodiment. However, the size of the single step may be different in other embodiments.

Responsive to the error value 151 in step 403 indicating that the pulse width of the second dummy enable signal dent is greater than the pulse width of the first dummy enable signal den0, the duty cycle and phase calibration circuit 139 determines a correction that increases the delay between of the second dummy data signal dd1 and the first dummy data signal dd0. In one embodiment, the duty cycle and phase calibration circuit 139 increases the delay by moving the second dummy data signal dd1 by a single step in the second direction.

The duty cycle and phase calibration circuit 139 determines a phase correction signal 129 for the clock signal associated with the second dummy data signal dd1. Here, DCC corrected clock signal 133B (and its corresponding clock signals 113B, 119B, 131B, and 135B) is associated with the second dummy data signal dd1. Thus, the duty cycle and phase calibration circuit 139 determines the phase correction signal 129 to correct the phase of the duty cycle corrected clock signal 119B based on the correction for the second dummy data signal dd1. In one embodiment, the amount of correction specified in the phase correction signal 129 is the same (e.g., matches) the amount of correction for the second dummy data signal dd1.

In one embodiment, the calibrator circuit 127 repeats the above steps 601 to 605 for phase calibration of the dummy data signals until the pulse widths of the third dummy enable signal den2 with the second dummy enable signal den1 match. Once duty cycle calibration and phase calibration are complete, the calibrator circuit 127 is disabled (e.g., turned off) or may remain on for real time calibration as previously described above.

Method Flow Diagrams

Figure 7:
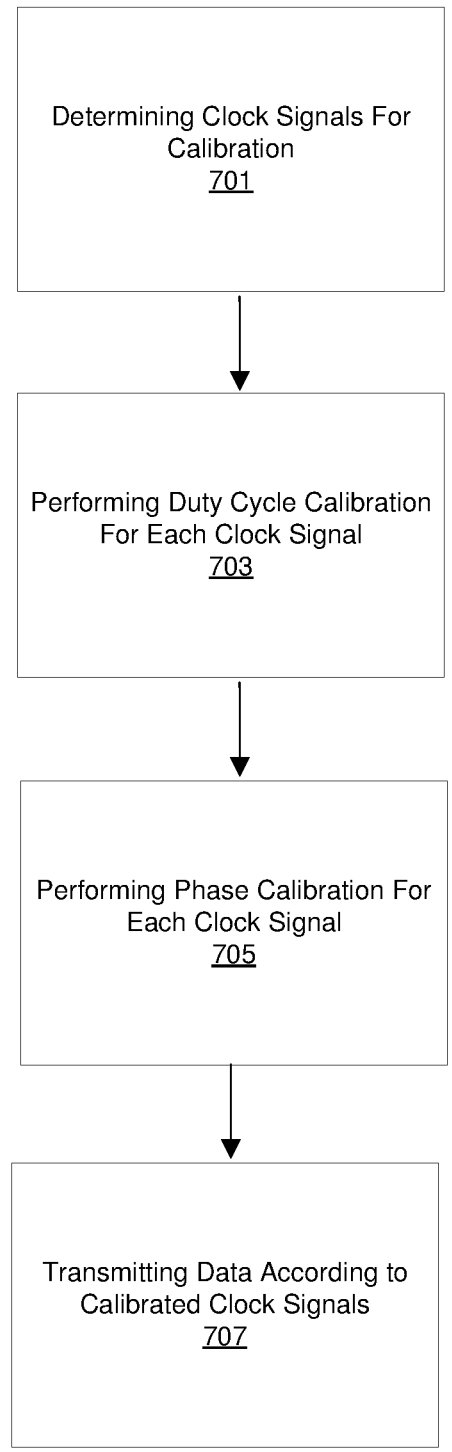
FIG. 7 illustrates a method flow diagram describing a method of the transmitter device for transmitting data, according to an embodiment.

FIG. 7 is a method flow diagram describing data transmission of the transmitter device 101 according to one embodiment. Note in other embodiments, other steps may be shown than those illustrated in FIG. 7.

In one embodiment, the transmitter device 101 determines 701 clock signals for calibration. The clocks signals may be calibrated during a calibration mode of the transmitter device 101. The transmitter device 101 performs 703 duty cycle calibration for each clock signal. During duty cycle calibration, each clock signal is calibrated to have a 50% duty cycle, for example. After duty cycle calibration is completed, the transmitter device 701 performs 705 phase calibration for each clock signal. During phase calibration, the clock signals are calibrated to have a 90-degree phase shift between each clock signal, for example. Once the clock signals are duty cycle calibrated and phase calibrated, the transmitter device 101 transmits 707 data to the receiver device 103 according to the calibrated clock signals.

Figure 8:
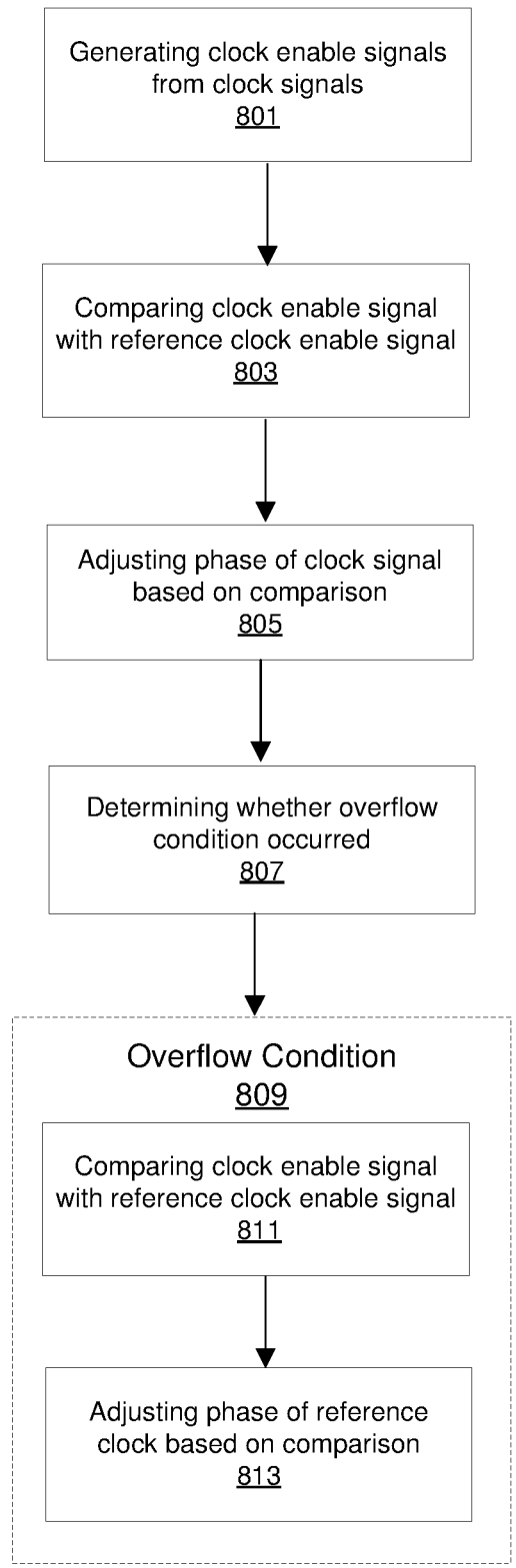
FIG. 8 illustrates a method flow diagram describing phase correction of the clock signals using the clock signals, according to one embodiment.

FIG. 8 is a method flow diagram describing the process for performing 705 phase calibration of clock signals according to a first embodiment. In the first embodiment, phase calibration is performed using the clock signals themselves. Note in other embodiments, other steps may be shown than those illustrated in FIG. 8.

In one embodiment, the transmitter device 101 generates 801 a plurality of enable signals (e.g., corrected pulse signals 135) from a plurality of clock signals (e.g., DCC corrected clock signals 133). Each enable signal is a waveform that indicates a period of time when a pair of clock signals are both simultaneously at a high-level (e.g., logic level 1). Each enable signal is generated using different pairs of clock signals. The clock signals from which the enable signals are generated are only duty cycle corrected and one of the clock signals is used as a reference clock signal during phase calibration in one embodiment.

In one embodiment, one of the enable signals from the plurality of enable data signals is used as a reference enable signal for phase calibration. The transmitter device 101 compares 803 each enable signal with the reference enable signal in a predetermined order to determine whether a pulse width of an enable signal matches a pulse width of the reference enable signal. The transmitter device 101 adjusts

805 a phase of a clock signal from the plurality of clock signals that is associated with the enable signal based on the comparison. For example, the transmitter device 101 may reduce the delay of the associated clock signal or increase the delay of the associated clock signal until the pulse widths of the enable signal and reference signal match.

In one embodiment, the transmitter device 101 determines 807 whether an overflow condition 809 occurred. The overflow condition 809 occurs when the amount of phase adjustment of the clock signal being calibrated is greater than a threshold value. If the overflow condition did not occur, the next clock signal in the predetermined order is calibrated.

However, if the overflow condition 809 occurred, the transmitter device 101 reverts the adjustment to the clock signal and again compares 811 the enable signal with the reference enable signal 811. The comparison indicates the amount of mismatch between the pulse widths of the enable signal and the reference enable signal. Rather than adjusting the clock signal that is associated with the enable signal, the transmitter device 101 adjusts 813 the phase of the reference clock until the pulse widths of the enable signal and the reference enable signal match.

The above process shown in FIG. 8 is repeated for each of the clock signals except for the reference clock signal until the pulse widths of a predetermined pair of enable signals match. For example, phase calibration is complete once the pulse widths of the second and third enable signals en1 and en2 from first to fourth enable signals match, as previously described above.

Figure 9:
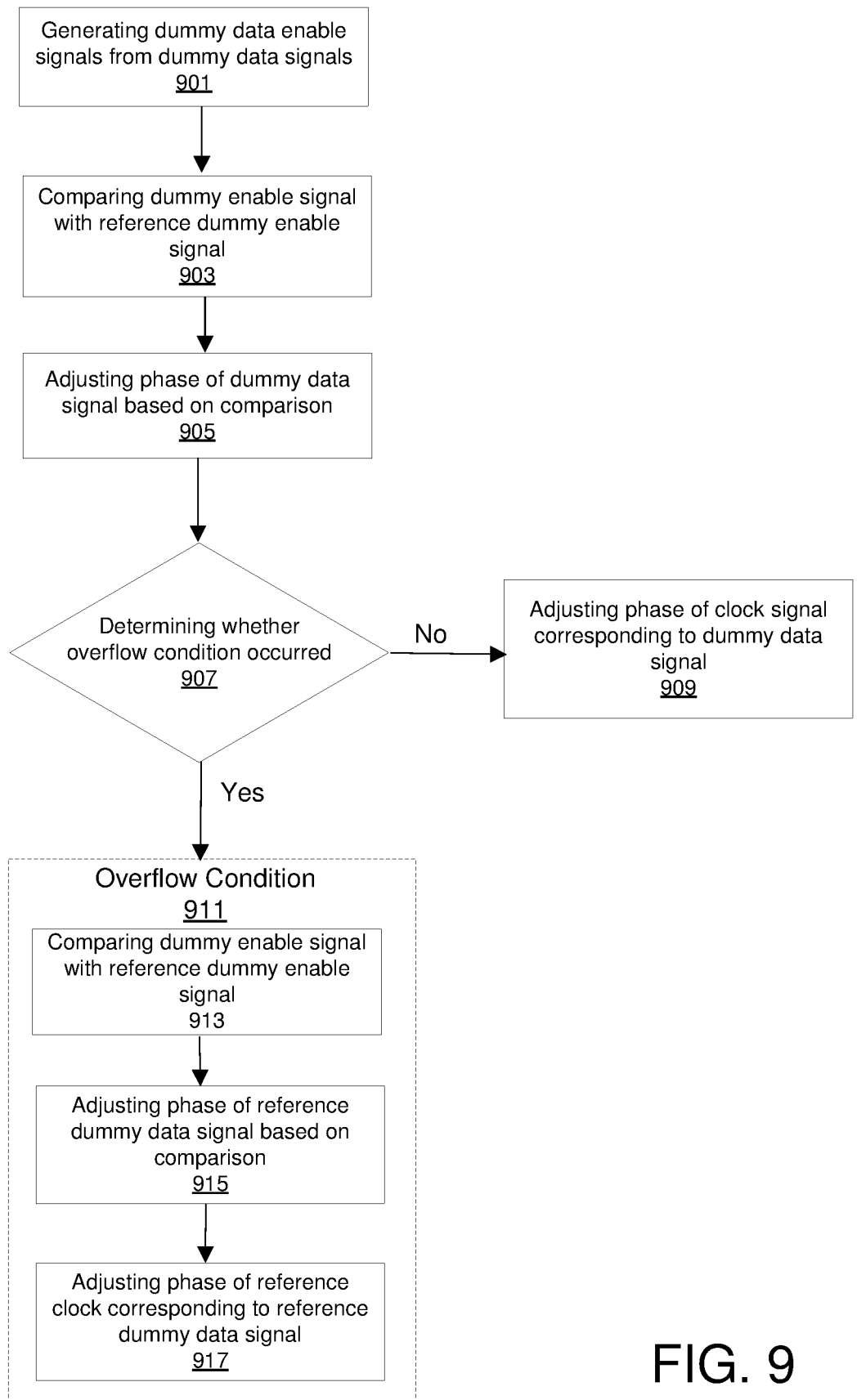
FIG. 9 illustrates a method flow diagram describing phase correction of the clock signals using the dummy data signals, according to another embodiment.

FIG. 9 is a method flow diagram describing the process for performing 705 phase calibration of clock signals according to a second embodiment. In the second embodiment, phase calibration is performed using the dummy data signals that are used as proxies for the clock signals themselves. Note in other embodiments, other steps may be shown than those illustrated in FIG. 9.

In one embodiment, the transmitter device 101 generates 901 a plurality of dummy enable signals from a plurality of dummy data signals. The dummy data signals are generated by a dummy transmitter circuit that mimics the skew that occurs in a transmitter circuit that transmits data to the receiver device 103. Each dummy enable signal is a waveform that indicates a period of time when a pair of dummy data signals are both simultaneously at a high-level (e.g., logic level 1). Each dummy enable signal is generated using different pairs of dummy data signals. The dummy data signals from which the dummy enable signals are generated are only duty cycle corrected and one of the dummy data signals is used as a reference dummy data signal during phase calibration in one embodiment.

In one embodiment, one of the dummy enable signals from the plurality of dummy enable data signals is used as a reference dummy enable signal for phase calibration. The transmitter device 101 compares 903 each dummy enable signal with the reference dummy enable signal in a predetermined order to determine whether a pulse width of the dummy enable signal matches a pulse width of the reference dummy enable signal. The transmitter device 101 adjusts 905 a phase of a dummy data signal from the plurality of dummy data signals that is associated with the dummy enable signal based on the comparison. For example, the transmitter device 101 may reduce the delay of the associated dummy data signal or increase the delay of the associated dummy data signal until the pulse widths of the dummy enable signal and reference dummy enable signal match.

In one embodiment, the transmitter device 101 determines 907 whether an overflow condition 911 occurred. The overflow condition 907 occurs when the amount of phase adjustment of the dummy data signal being calibrated is greater than a threshold value. If the overflow condition did not occur, a phase of a clock signal that corresponds to the dummy data signal under calibration is adjusted 909. As mentioned above, each dummy data signal is used as a proxy for one of the clock signals for phase calibration of the clock signals. The amount of adjustment to the clock signal that is associated with the adjusted dummy data signal is proportional (e.g., the same) as the adjustment made to the dummy data signal. The next dummy data signal in the predetermined order is then calibrated.

However, if the overflow condition 911 occurred, the transmitter device 101 reverts the phase adjustment to the dummy data signal and again compares 913 the dummy enable signal with the reference dummy enable signal. The comparison indicates the amount of mismatch between the pulse widths of the dummy enable signal and the reference dummy enable signal. Rather than adjusting the dummy data signal that is associated with the dummy enable signal, the transmitter device 101 adjusts 915 the phase of the reference dummy data signal until the pulse widths of the dummy enable signal and the reference dummy enable signal match. A phase of a clock signal that corresponds to the reference dummy data signal is adjusted 917 by the transmitter device 101.

The above process shown in FIG. 9 is repeated for each of the dummy data signals until the pulse widths of a predetermined pair of dummy data signals match. For example, phase calibration is complete once the pulse widths of the second and third dummy enable signals dent and den2 from first to fourth dummy enable signals match, as previously described above.

Additional Configuration Considerations

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the disclosure. This description should be read to include one or at least one and the singular also includes the plural unless it is obvious that it is meant otherwise.

Upon reading this disclosure, those of skill in the art will appreciate still additional alternative structural and functional designs for a receiver having ADCs with an adjustable sampling clock through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A transmitter device comprising:
   a clock calibrator circuit that performs phase calibration of a plurality of clock signals including a first clock signal, a second clock signal, a third clock signal, and a fourth clock signal, each of the plurality of calibrated clock signals having a same frequency but a different phase; and
   a plurality of transmitter circuits coupled to a communications channel, each of the plurality of transmitter circuits transmitting data to a receiver device over the communications channel according to a corresponding one of the plurality of calibrated clock signals,
   wherein the clock calibrator circuit performs the phase calibration by:
      generating a reference enable signal having a reference pulse at a first level that corresponds to a time period when the first clock signal and the second clock signal are simultaneously at the first level;
      generating a first enable signal that is associated with the fourth clock signal, the first enable signal having a first pulse at the first level that corresponds to a time period when the first clock signal and the fourth clock signal are simultaneously at the first level; and
      adjusting the phase of the fourth clock signal until a pulse width of the reference pulse matches a pulse width of the first pulse of the first enable signal.

2. The transmitter device of claim 1, further comprising:
   comparing the pulse width of the reference pulse and the pulse width of the first pulse of the first enable signal to generate a first magnitude of phase adjustment for the phase of the fourth clock signal;
   responsive to the pulse width of the reference pulse being greater than the pulse width of the first pulse of the first enable signal, adjusting the phase of the fourth clock signal in a first direction by the first magnitude of phase adjustment; and
   responsive to the pulse width of the reference pulse being less than the pulse width of the first pulse of the first enable signal, adjusting the phase of the fourth clock signal in a second direction that is opposite the first direction by the first magnitude of phase adjustment.

3. The transmitter device of claim 2, further comprising:
   responsive to the first magnitude of phase adjustment for the phase of the fourth clock signal being greater than a threshold, adjusting a phase of a reference clock signal from the plurality of clock signals rather than adjusting the phase of the fourth clock signal, the phase of the reference clock signal adjusted until the pulse width of the reference pulse matches the pulse width of the first pulse of the first enable signal,
   wherein the reference clock signal is the first clock signal.

4. The transmitter device of claim 3, further comprising:
   generating a second enable signal that is associated with the third clock signal, the second enable signal having a second pulse at the first level that corresponds to a time period when the third clock signal and the fourth clock signal are simultaneously at the first level;
   comparing the pulse width of the reference pulse and a pulse width of the second pulse of the second enable signal to generate a second magnitude of phase adjustment for the phase of the third clock signal;
   responsive to the pulse width of the reference pulse being greater than the pulse width of the second pulse of the second enable signal, adjusting the phase of the third clock signal in the first direction by the second magnitude of phase adjustment; and
   responsive to the pulse width of the reference pulse being less than the pulse width of the second pulse of the second enable signal, adjusting the phase of the third clock signal in the second direction by the second magnitude of phase adjustment.

5. The transmitter device of claim 4, further comprising:
   responsive to the second magnitude of phase adjustment for the phase of the third clock signal being greater than the threshold, adjusting the phase of the reference clock signal rather than adjusting the phase of the third clock signal, the phase of the reference clock signal adjusted until the pulse width of the reference pulse matches the pulse width of the second pulse of the third enable signal.

6. The transmitter device of claim 5, further comprising:
   generating a third enable signal that is associated with the second clock signal, the third enable signal having a third pulse at the first level that corresponds to a time period when the second clock signal and the third clock signal are simultaneously at the first level;
   comparing the pulse width of the reference pulse and a pulse width of the third pulse of the third enable signal to generate a third magnitude of phase adjustment for the phase of the second clock signal;
   responsive to the pulse width of the reference pulse matching the pulse width of the third pulse of the third enable signal, determining that the plurality of clock signals are phase calibrated;
   responsive to the pulse width of the reference pulse not matching the pulse width of the third pulse of the third enable signal, adjusting the phase of the second clock signal.

7. The transmitter device of claim 6, wherein adjusting the phase of the second clock signal comprises:

responsive to the pulse width of the reference pulse being greater than the pulse width of the third pulse of the third enable signal, adjusting the phase of the second clock signal in the first direction by a single step; and responsive to the pulse width of the reference pulse being less than the pulse width of the third pulse of the third enable signal, adjusting the phase of the second clock signal in the second direction by the single step.

8. The transmitter device of claim 7, further comprising:
re-calibrating the plurality of clock signals after the adjustment of the phase of the second clock signal until the pulse width of the reference pulse matches the pulse width of the third pulse of the third enable signal.

9. The transmitter device of claim 7, wherein the clock calibrator circuit is powered down responsive to determining that the plurality of clock signals are calibrated.

10. The transmitter device of claim 7, wherein the calibrated first clock signal, the calibrated second clock signal, the calibrated third clock signal, and the calibrated clock signal each have a 90-degree phase shift from another one of the plurality of clock signals.

11. A transmitter device comprising:
a clock calibrator circuit that performs phase calibration of a plurality of clock signals including a first clock signal, a second clock signal, a third clock signal, and a fourth clock signal, each of the plurality of calibrated clock signals having a same frequency but a different phase;
a first plurality of transmitter circuits coupled to a communications channel, each of the first plurality of transmitter circuits transmitting data to a receiver device over the communications channel according to a corresponding one of the plurality of calibrated clock signals; and
a second plurality of transmitter circuits coupled to the clock calibrator circuit, at least one of the second plurality of transmitter circuits transmitting a plurality of dummy data signals to the clock calibrator circuit, the plurality of dummy data signals including a first dummy data signal, a second dummy data signal, a third dummy data signal, and a fourth dummy data signal;
wherein the clock calibrator circuit performs the phase calibration by:
generating a reference enable signal having a reference pulse at a first level that corresponds to a time period when the first dummy data signal and the second dummy data signal are simultaneously at the first level;
generating a first enable signal that is associated with the fourth dummy data signal, the first enable signal having a first pulse at the first level that corresponds to a time period when the first dummy data signal and the fourth dummy data signal are simultaneously at the first level;
adjusting the phase of the fourth dummy data signal until a pulse width of the reference pulse matches a pulse width of the first pulse of the first enable signal; and
adjusting a phase of one of the plurality of clock signals that is associated with the fourth dummy data signal based on the adjusted phase of the fourth dummy data signal.

12. The transmitter device of claim 11, wherein the phase of the fourth clock signal is adjusted based on the adjusted phase of the fourth dummy data signal.

13. The transmitter device of claim 11, further comprising:
comparing the pulse width of the reference pulse and the pulse width of the first pulse of the first enable signal to generate a first magnitude of phase adjustment for the phase of the fourth dummy data signal;
responsive to the pulse width of the reference pulse being greater than the pulse width of the first pulse of the first enable signal, adjusting the phase of the fourth dummy data signal in a first direction by the first magnitude of phase adjustment of the fourth dummy data signal; and
responsive to the pulse width of the reference pulse being less than the pulse width of the first pulse of the first enable signal, adjusting the phase of the fourth dummy data signal in a second direction that is opposite the first direction by the first magnitude of phase adjustment of the fourth dummy data signal.

14. The transmitter device of claim 13, further comprising:
responsive to the first magnitude of phase adjustment for the phase of the fourth dummy data signal being less than a threshold, the phase of the fourth clock signal is adjusted based on the first magnitude of phase adjustment of the fourth dummy data signal;
responsive to the first magnitude of phase adjustment being greater than the threshold:
adjusting a phase of a reference dummy data signal from the plurality of dummy data signals rather than adjusting the phase of the fourth dummy data signal, the phase of the reference dummy data signal adjusted until the pulse width of the reference pulse matches the pulse width of the first pulse of the first enable signal, wherein the reference dummy data signal is the first dummy data signal; and
adjusting a phase of the first clock signal based on the adjusted phase of the reference dummy data signal.

15. The transmitter device of claim 14, further comprising:
generating a second enable signal that is associated with the third dummy data signal, the second enable signal having a second pulse at the first level that corresponds to a time period when the third dummy data signal and the fourth dummy data signal are simultaneously at the first level;
comparing the pulse width of the reference pulse and a pulse width of the second pulse of the second enable signal to generate a second magnitude of phase adjustment for the phase of the third dummy data signal;
responsive to the pulse width of the reference pulse being greater than the pulse width of the second pulse of the second enable signal, adjusting the phase of the third dummy data signal in the first direction by the second magnitude of phase adjustment; and
responsive to the pulse width of the reference pulse being less than the pulse width of the second pulse of the second enable signal, adjusting the phase of the third dummy data signal in the second direction by the second magnitude of phase adjustment.

16. The transmitter device of claim 15, further comprising:
responsive to the second magnitude of phase adjustment for the phase of the third dummy data signal being less than a threshold, the phase of the third clock signal is adjusted based on the second magnitude of phase adjustment of the third dummy data signal;

responsive to the second magnitude of phase adjustment for the phase of the third dummy data signal being greater than the threshold:
  adjusting the phase of the reference dummy data signal rather than adjusting the phase of the third dummy data signal, the phase of the reference data signal adjusted until the pulse width of the reference pulse matches the pulse width of the second pulse of the third enable signal; and
  adjusting a phase of the third clock signal based on the adjusted phase of the reference dummy data signal.

17. The transmitter device of claim 16, further comprising:
  generating a third enable signal that is associated with the second dummy data signal, the third enable signal having a third pulse at the first level that corresponds to a time period when the second dummy data signal and the third dummy data signal are simultaneously at the first level;
  comparing the pulse width of the reference pulse and a pulse width of the third pulse of the third enable signal to generate a third magnitude of phase adjustment for the phase of the second dummy data signal;
  responsive to the pulse width of the reference pulse matching the pulse width of the third pulse of the third enable signal, determining that the plurality of clock signals are phase calibrated;
  responsive to the pulse width of the reference pulse not matching the pulse width of the third pulse of the third enable signal, adjusting the phase of the second dummy data signal.

18. The transmitter device of claim 17, wherein adjusting the phase of the second dummy data signal comprises:
  responsive to the pulse width of the reference pulse being greater than the pulse width of the third pulse of the third enable signal:
    adjusting the phase of the second dummy data signal in the first direction by a single step; and
    adjusting the phase of the second clock signal in the first direction based on the adjusted phase of the second dummy data signal;
  responsive to the pulse width of the reference pulse being less than the pulse width of the third pulse of the third enable signal:
    adjusting the phase of the second dummy data signal in the second direction by the single step; and
    adjusting the phase of the second clock signal in the second direction based on the adjusted phase of the second dummy data signal.

19. The transmitter device of claim 18, further comprising:
  re-calibrating the plurality of clock signals after the adjustment of the phase of the second clock signal using the plurality of dummy data signals until the pulse width of the reference pulse matches the pulse width of the third pulse of the third enable signal.

20. The transmitter device of claim 19, wherein the clock calibrator circuit is powered down responsive to determining that the plurality of clock signals are calibrated.

21. The transmitter device of claim 11, wherein the plurality of dummy data signals each include a different predetermined data pattern.

22. A method of a transmitter device comprising:
  performing phase calibration of a plurality of clock signals including a first clock signal, a second clock signal, a third clock signal, and a fourth clock signal, each of the plurality of calibrated clock signals having a same frequency but a different phase; and
  transmitting data to a receiver device over the communication channel according to the plurality of calibrated clock signals,
  wherein performing the phase calibration includes:
    generating a reference enable signal having a reference pulse at a first level that corresponds to a time period when the first clock signal and the second clock signal are simultaneously at the first level;
    generating a first enable signal that is associated with the fourth clock signal, the first enable signal having a first pulse at the first level that corresponds to a time period when the first clock signal and the fourth clock signal are simultaneously at the first level; and
    adjusting the phase of the fourth clock signal until a pulse width of the reference pulse matches a pulse width of the first pulse of the first enable signal.

23. A method of a transmitter device comprising:
  performing phase calibration of a plurality of clock signals including a first clock signal, a second clock signal, a third clock signal, and a fourth clock signal, each of the plurality of calibrated clock signals having a same frequency but a different phase;
  transmitting data to a receiver device over the communication channel according to the plurality of calibrated clock signals; and
  generating a plurality of dummy data signals for calibrating the plurality of clock signals, the plurality of dummy data signals including a first dummy data signal, a second dummy data signal, a third dummy data signal, and a fourth dummy data signal,
  wherein performing the phase calibration comprises:
    generating a reference enable signal having a reference pulse at a first level that corresponds to a time period when the first dummy data signal and the second dummy data signal are simultaneously at the first level;
    generating a first enable signal that is associated with the fourth dummy data signal, the first enable signal having a first pulse at the first level that corresponds to a time period when the first dummy data signal and the fourth dummy data signal are simultaneously at the first level;
    adjusting the phase of the fourth dummy data signal until a pulse width of the reference pulse matches a pulse width of the first pulse of the first enable signal; and
    adjusting a phase one of the plurality of clock signals that is associated with the fourth dummy data signal based on the adjusted phase of the fourth data signal.

* * * * *